United States Patent [19]
Holschwandner et al.

[11] Patent Number: 5,227,335
[45] Date of Patent: Jul. 13, 1993

[54] TUNGSTEN METALLIZATION

[75] Inventors: Lowell H. Holschwandner, Fountain Hill; Virendra V. S. Rana, South Whitehall Township, Lehigh County, both of Pa.

[73] Assignee: AT&T Bell Laboratories, Murray Hill, N.J.

[21] Appl. No.: 517,973

[22] Filed: Apr. 30, 1990

Related U.S. Application Data

[63] Continuation of Ser. No. 338,473, Apr. 14, 1989, abandoned, which is a continuation of Ser. No. 929,043, Nov. 10, 1986, abandoned.

[51] Int. Cl.$^5$ .......................................... H01L 21/283
[52] U.S. Cl. .................................. 437/192; 437/190; 437/194; 437/246
[58] Field of Search ............... 437/192, 190, 245, 246, 437/194

[56] References Cited

U.S. PATENT DOCUMENTS

| 3,697,343 | 10/1972 | Cuomo et al. | 437/962 |
| 4,394,678 | 7/1983 | Winchell et al. | 357/68 |
| 4,650,696 | 3/1987 | Raby | 427/89 |
| 4,666,737 | 5/1987 | Gimpelson et al. | 427/89 |

FOREIGN PATENT DOCUMENTS

| 1955716 | 5/1971 | Fed. Rep. of Germany | 437/192 |
| 0211269 | 12/1982 | Japan | 437/192 |

OTHER PUBLICATIONS

Wittmer, M., J. Vac. Sci. Technol. A2(2), Apr.-Jun., 1984, pp. 273-279.
Mehta, S., et al., "Blanket CVD Tungsten . . . ",Jun. 9-10, 1986, V-MIC. Conf., pp. 418-435.
Higelin, G., et al., "A Contact Filling . . . ", Jun. 9-10, 1986, V-MIC Conf., pp. 443-449.
Smith; G., et al., "Comparison of Two Contact Plug . . . ", Jun. 9-10, 1986, V-MIC Conf., pp. 403-410.
Brols, D., et al., "CVD Tungsten . . . " Solid State Technology, Apr. 1984, pp. 313-314.
"Tungsten-on-Conducting Nitride . . . " IBM Technical Disc. Bull., vol. 31, No. 3, Aug. 1988, pp. 477-478.
Saraswat, K., et al., "Selective VCD of Tungsten . . . ", Procs. Second Int. Symp. VLSI, vol. 84-7, 1984, pp. 409-419.
Miller, N., et al., "Hot Wall CVD Tungsten . . . ", Solid State Technology, Dec. 1980, pp. 79-81.
Nicollet, M. A., "Diffusion Barriers . . . ", Thin Solid Films, vol. 52, 1978, pp. 415-432.
Wittmer, M., Appl. Phys Lett., 36(6), Mar. 15, 1980, pp. 456-458.
Rosser, P. J., et al., Mat. Res. Soc. Symp. Proc. vol. 37, 1985 Material Research Society, pp. 607-612.

Primary Examiner—T. N. Quach
Attorney, Agent, or Firm—Richard D. Laumann

[57] ABSTRACT

The adhesion of tungsten to an underlying dielectric layer is improved by the use of a thin glue layer of either TiN or Al.

11 Claims, 2 Drawing Sheets

TUNGSTEN METALLIZATION

This application is a continuation of application Ser. No. 338,473, filed on Apr. 14, 1989, abandoned, which is a continuation of application Ser. No. 929,043, filed on Nov. 10, 1986, abandoned.

TECHNICAL FIELD

This invention relates generally to metallizations used in semiconductor devices, and particularly to devices having such metallizations which use tungsten.

BACKGROUND OF THE INVENTION

As the complexity of integrated circuits continues to increase, the dimensions of the components of the integrated circuits continue to decrease. Not only do device dimensions decrease, but the dimensions of the interconnects, that is, the lines and windows used to connect devices decrease. The windows are often termed vias by those skilled in the art. It is noted that the term window is sometimes applied only to the openings to the source, gate, or drain electrodes while the term via is applied to the opening between levels in multilevel metal structures. Vias may be conveniently visualized as cylinders which are filled with a metal so that, e.g., devices located on different metallization levels can be electrically connected. As it is difficult to completely fill a small diameter cylinder with sputtered Al, a metal commonly used in integrated circuit metallizations, a heating step is frequently used to cause an overlying dielectric layer to flow into a portion of the via. The heating step creates a more easily filled conical shape. The conical shape is, of course, truncated at the bottom so that an electrical contact can be formed to the underlying conductor.

As smaller devices typically use relatively shallower junction depths than do larger devices, the use of high temperature thermal processing to taper the vias by causing a dielectric material to flow eventually becomes impossible as the via dimensions decrease. Consequently, the vias that must be filled with metal not only have a high aspect ratio, that is, a high ratio of height to width, but their walls are also substantially vertical. Aluminum is difficult to deposit uniformly in such vias and poor step coverage results for conventional deposition techniques such as sputtering. This not only leads to possible discontinuities in the metal coverage but also makes planarization of the surface, frequently required for subsequent processing such as second level metallization, very difficult.

Al metallizations suffer from several drawbacks. Al has a low electromigration resistance and is susceptible to hillock formation. Also, because of its low melting point and tendency to react with Si, severe limitations are placed on the maximum temperature that can be used in post-metallization processing.

Accordingly, alternatives to aluminum have been sought for at least portions of the metallization. One commonly contemplated alternative metal is low pressure chemical vapor deposition (LPCVD) tungsten. LPCVD tungsten is a desirable alternative because it has a conformal step coverage. LPCVD tungsten also offers advantages for use as interconnects. Besides having conformal step coverage, it has high electromigration resistance, resistance to hillock formation and high temperature stability. Although many methods of depositing LPCVD tungsten have been proposed, they are all included within two generic categories which are conveniently termed selective and blanket.

Selective deposition typically relies upon the reaction of a gas, such as tungsten hexafluoride, with substrates, such as silicon, to leave tungsten on the silicon surface. Selective deposition is also possible on metals and silicides. A carrier gas, such as hydrogen, is commonly used. Tungsten hexafluoride does not react with other materials, such as a surrounding dielectric region of silicon dioxide, and in theory, tungsten is deposited only on the silicon surface. However, selective deposition is difficult to obtain in practice in the thicknesses which are needed to fill deep vias because of the loss of selectivity. This probably arises because some tungsten hexafluoride reacts with the hydrogen carrier gas thus forming HF as well as nucleating W. HF reacts with and etches the $SiO_2$, which is obviously an undesirable result.

With blanket deposition, tungsten is deposited over the entire surface and then etched back so that tungsten ideally remains only in the vias or as, for example, interconnects. While this process is conceptually simple, tungsten does not adhere well to silicon dioxide and practical problems arise. For example, after the deposition has been completed, the tungsten film may simply peel off the silicon dioxide which is also an obviously undesirable result.

The use of a glue layer has been proposed to overcome the adhesion problem just discussed. A glue layer is a layer of material deposited prior to the tungsten and which has good adhesion both to the underlying dielectric layer and to the tungsten. Several substances have been proposed for glue layers. For example, the use of both elemental metals, such as Ti, and metallic silicides, such as $WSi_2$, has been proposed. See, for example, Comparison of Two Contact Plug Techniques for Use with Planarized Oxide and A Contact Filling Process with CVD-Tungsten for Multilevel Metallization Systems, Proceedings of the V-MIC Conference, pp. 403–410, and pp. 443–449, Jun. 9–10, 1986, respectively. A common feature of the approaches adopted by these references is the use of relatively thick glue layers. Thicknesses of approximately 100 nm or more were used. It should be noted that the thickness of the Ti layer in the former reference is not explicitly given. However, FIG. 3 illustrates a plug after etching has been completed. It is evident that there is severe overetching of the glue layer which would not be visible if a thin glue layer had been used.

However, the use of a thick glue layer is undesirable because during the etch back step, severe undercutting of the tungsten layer occurs if, as is often the case, the glue layer etches more rapidly than does the tungsten. The undercutting may make subsequent processing very difficult. For example, voids may be left in the oxide and in subsequent metallizations after metal deposition.

Of course, the glue layer material should be electrically conducting. Only metals or silicides have been proposed as glue layer materials because of the rapid film growth in these materials. However, the use of some metals, such as aluminum, has not been seriously considered because a thick aluminum layer may cause spiking due to its rapid diffusion into the underlying material. Other conducting compounds have not yet been proposed as glue layers.

SUMMARY OF THE INVENTION

We have found that tungsten can be blanket deposited with good adhesion over a dielectric covering a portion of a silicon surface by first depositing a film comprising either Al or a conducting nitride such as TiN as a glue layer. The glue layer film may be deposited, through openings in the dielectric, directly on the silicon or on a conducting material, such as a silicide, overlying the silicon. Of course, the glue layer is also deposited on the dielectric. Both TiN and Al films provide good adhesion down to thicknesses as small as approximately 3 nm. The minimum thickness is determined primarily by the requirement that the entire wafer surface be covered adequately. The thinner glue layers are generally preferred as they minimize any problems that might be caused by either spiking of deposited metal or undercutting during reactive sputter etching (RSE). However, if interaction of W with the substrate is to be prevented, a thicker layer of TiN may be used. To prevent spiking, the Al layer is typically less than 25 nm thick although the maximum thickness will be determined by device design and processing parameters. Uses other than plugs are contemplated. In particular, interconnects and gate structures are also contemplated.

For reasons of clarity, the elements of the devices depicted are not drawn to scale.

DETAILED DESCRIPTION

Figure 1:
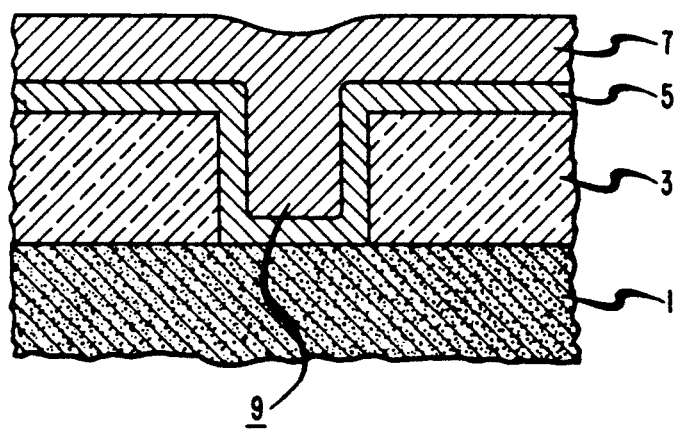
FIG. 1 is a schematic representation of a exemplary metallization according to this invention.

Our invention will be described by reference to FIG. 1 which is a schematic representation of a tungsten metallization according to this invention. Depicted are silicon layer 1, dielectric region 3, glue layer 5 and tungsten metallization 7. As can be seen, the glue layer and metallization extend into a via 9. The glue layer covers the interior surface of the via as well as the underlying silicon layer 1. The glue layer also covers the dielectric region 3. It will be readily appreciated that the individual components of the integrated circuit are not depicted for reasons of clarity.

The vias are formed by conventional VLSI processing steps which deposit, pattern and etch the dielectric, etc. These steps are well known to those skilled in the art and need not be described in detail. The dielectric region depicted comprises $SiO_2$ although it will be appreciated by those skilled in the art that other dielectric materials may be used. For example, B and P doped $SiO_2$ and $Si_3N_4$ might be used. It will also be appreciated that although layer 1 is described as silicon, other conducting materials might be used. For example, conducting silicides might be used. Such silicides are formed on the silicon surface. Thus, while the glue layer is described as being deposited over a silicon surface, the presence of other materials between the glue layer and the silicon surface is contemplated.

The glue layer is expediently deposited by well known techniques such as sputtering. The glue layer comprises at least one material selected from the group consisting of Al and conducting nitrides such as TiN. It will be appreciated that minor amounts of other materials may be present in the glue layer. For example, either or both Si and Cu may be present in Al. These materials are metallurgically stable with respect to the tungsten film. Good adhesion, as evidenced by an inability to remove the film by pulling on an attached adhesive tape, is obtained down to glue layer thicknesses of approximately 3 nm.

The native oxides on TiN and $Al_2O_3$ are thin. Although the successful use of Al might seem surprising in view of its strong susceptibility to oxide formation, it is believed that during the tungsten deposition most of the aluminum oxide present is removed although residues of non-conductive fluorides may remain. To prevent spiking, the Al layer should be less than approximately 25 nm thick. However, as will be readily appreciated by those skilled in the art, a precise maximum thickness cannot be given as it depends on several factors. These factors include the desired junction depth and the post Al deposition processing parameters. Given these factors, one skilled in the art can readily determine the maximum Al thickness.

The thinness of the glue layer is surprising but it must be noted, in retrospect, that pinholes in the glue layer need not be a significant problem. That is, the presence of some pinholes will not necessarily adversely affect the adhesive properties sought. It must also be remembered that, within the vias, pinholes are not significant as the electrical contact will still be formed if W goes through a pinhole at the bottom of the via provided that there is no chemical interaction with the substrate. For example, W interaction with, e.g., $TiS_2$, is not a problem. However, pinholes may be a problem for the W/Si interface although the interaction of W with a small amount of silicon can generally be tolerated. No adverse results occurs if the W touches the dielectric through a pinhole.

The growth of W films on the nitrides is surprising because it is hypothesized there are no displacement reactions which provide W nuclei for further film growth, i.e., the nitrides do not reduce $WF_6$. The Ti-N bonds are sufficiently strong so that the interaction of Ti with $WF_6$ is not energetically favored. The growth of W films on the nitrides is believed to occur by the reduction of $WF_6$ with $H_2$, solely. Upon exposure to $WF_6$ and $H_2$, H and F atoms react and nucleate W on the surface. After the resulting islands coalesce, the growth rate of films is similar to the rates on Si or Al coated surfaces. The disadvantage of using a displacement reaction is that fluorides are formed at the interface.

Figure 2:
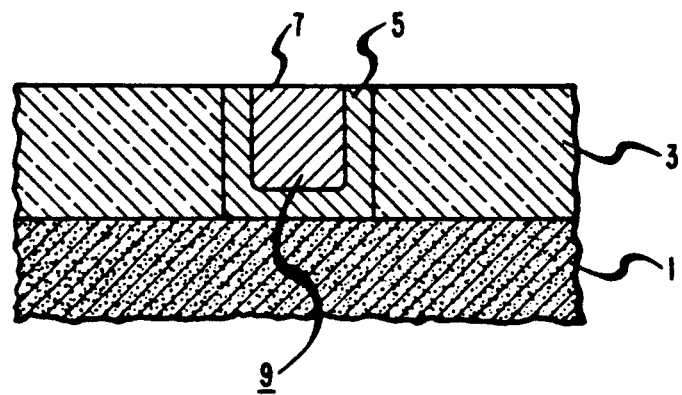
FIG. 2 is a schematic representation of a via filled with tungsten after the etching step has been completed.

FIG. 2 depicts a via after etching. Conventional etching techniques can be used for the etching steps. It should be remembered that the tungsten layer is typically overetched to guarantee its complete removal from areas not covered with resist in case there are non-uniformities in layer thickness. The overetch not only removes the tungsten but removes the thin glue layer contacting layer 1 without the need for any additional etching chemistry.

The absence of significant amounts of O and F at the W/TiN interface makes TiN ideally suited for use as a glue layer with etch-back plugs and interconnects.

The use of a thin layer also minimizes undercutting problems. It is apparent that a relatively planar surface is obtained in preparation for further processing. It should be noted that at most only a very thin layer of Al contacts the Si. This eliminates or minimizes the possibility of spiking which occurs with thicker Al films.

Figure 3:
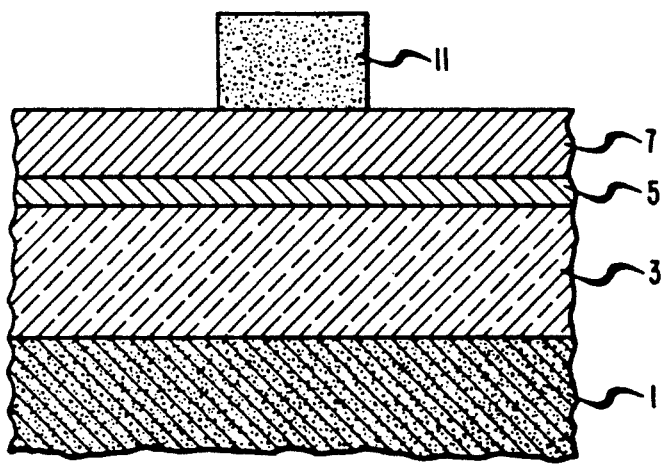
FIGS. 3 and 4 are schematic representations useful in explaining interconnects according to this invention.
Figure 4:
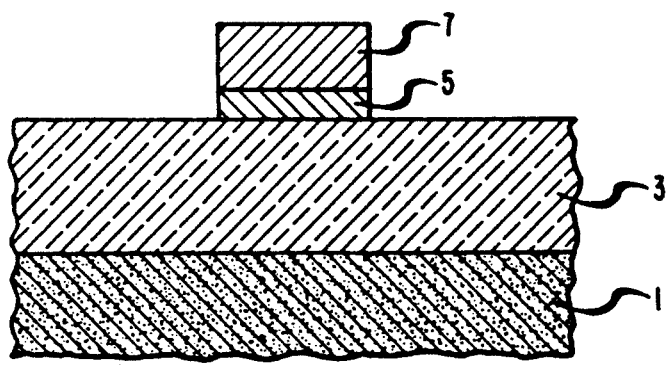

Other uses for our deposition process are contemplated. For example, it may be used to form interconnects or gate structures. The strong adhesion provided by thin glue layers is useful for patterning W interconnects. FIG. 3 is useful in explaining interconnect fabrication. Numerals identical to those used in FIG. 1 represent identical elements. Also depicted is patterned resist 11. To form interconnects, the tungsten and glue layers depicted are etched and the resist removed to yield the structure shown in FIG. 4. An Al layer under W interconnects should provide low resistance contacts. The use of Al is particularly suited for upper levels in multilevel metallization schemes where junction spiking is not a consideration. Also, it is suitable for very thin Al glue layer on Si contacts, as well as silicided junctions, where junction spiking may not occur.

What is claimed is:

1. A method of fabricating an integrated circuit comprising the steps of:
    patterning a dielectric layer to form holes which expose the underlying material, said exposed underlying material comprises an electrically conducting material;
    depositing a glue layer covering said dielectric and said exposed underlying material;
    depositing a tungsten layer by chemical vapor deposition, said tungsten layer covering said glue layer on said dielectric and said exposed material;
    CHARACTERIZED IN THAT said glue layer comprises at least one member selected from the group consisting of conducting nitrides.

2. A method as recited in claim 1 in which said material comprises said silicon surface.

3. A method as recited in claim 1 in which said material comprises a metallic silicide.

4. A method as recited in claim 1 further comprising etching said tungsten and said glue layer to form a planar surface of said dielectric and said tungsten in said hole, said tungsten being etched before said glue layer.

5. A method as recited in claim 4 in which said conducting nitride consists essentially of TiN.

6. A method as recited in claim 1 in which said dielectric comprises silicon dioxide.

7. A method as recited in claim 1 in which said W layer is deposited by low pressure chemical vapor deposition.

8. A method as recited in claim 7 in which said deposition uses $WF_6$ and $H_2$.

9. A method as recited in claim 8 in which said glue layer comprises a conducting nutride.

10. A method as recited in claim 8 in which said conducting nitride comprises TiN.

11. A method as recited in claim 1 further comprising the step of patterning said tungsten and said glue layer.

* * * * *

US005227335C1

(12) EX PARTE REEXAMINATION CERTIFICATE (7451st)
United States Patent
Holschwandner et al.

(10) Number: US 5,227,335 C1
(45) Certificate Issued: Apr. 13, 2010

(54) TUNGSTEN METALLIZATION

(75) Inventors: Lowell H. Holschwandner, Fountain Hill, PA (US); Virendra V. S. Rana, South Whitehall Township, PA (US)

(73) Assignee: Agere Systems Guardian Corp., Orlando, FL (US)

Reexamination Request:
No. 90/009,363, Dec. 12, 2008

Reexamination Certificate for:
Patent No.: 5,227,335
Issued: Jul. 13, 1993
Appl. No.: 07/517,973
Filed: Apr. 30, 1990

Related U.S. Application Data

(63) Continuation of application No. 07/338,473, filed on Apr. 14, 1989, now abandoned, which is a continuation of application No. 06/929,043, filed on Nov. 10, 1986, now abandoned.

(51) Int. Cl.
*H01L 21/02* (2006.01)
*H01L 21/768* (2006.01)
*H01L 21/70* (2006.01)
*H01L 21/3205* (2006.01)

(52) U.S. Cl. .................... 438/644; 438/648; 438/654; 257/E21.295; 257/E21.591

(58) Field of Classification Search ................ None
See application file for complete search history.

(56) References Cited

U.S. PATENT DOCUMENTS

| 575,002 | A | 1/1897 | De Lodyguine |
| 3,477,872 | A | 11/1969 | Amick |
| 3,573,570 | A | 4/1971 | Fuller et al. |
| 3,614,548 | A | 10/1971 | Inoue |
| 3,642,548 | A | 2/1972 | Eger |
| 3,655,438 | A | 4/1972 | Sterling et al. |
| 3,656,995 | A | 4/1972 | Reedy, Jr. |
| 3,663,320 | A | 5/1972 | Maruyama et al. |
| 3,665,254 | A | 5/1972 | Collard et al. |
| 3,697,343 | A | 10/1972 | Cuomo et al. |
| 3,704,116 | A | 11/1972 | Paris et al. |
| 3,784,402 | A | 1/1974 | Reedy, Jr. |
| 3,785,862 | A | 1/1974 | Grill |
| 3,854,443 | A | 12/1974 | Baerg |
| 3,879,746 | A | 4/1975 | Fournier |

(Continued)

FOREIGN PATENT DOCUMENTS

| DE | 1955716 | 5/1971 |
| EP | 0 123 936 A1 | 11/1984 |
| EP | 0 164 976 A2 | 12/1985 |
| EP | 211318 A1 | 2/1987 |
| EP | 0245627 A1 | 11/1987 |
| EP | 0269095 A2 | 6/1988 |
| EP | 0 319 214 A1 | 6/1989 |
| EP | 0 427 254 A2 | 5/1991 |
| GB | 2181456 A | 4/1987 |
| JP | 57-048249 A | 3/1982 |

(Continued)

OTHER PUBLICATIONS

Takenaka et al., "reactive ion etching of an Al–SI–TIW multilayer", 1987 Materials Research Society, Tungsten and Other Refractory Metals for VLSI Applicaitons II, Proceedings of the 1986 Workshop held Nov. 12–14, 1986, Palo Alto, CA, 1987, pp. 371–374.

Tandon et al., "Metallization Systems for Stable OHMIC Contacts to GaAs", 1985 Materials Research Society, Tungsten and Other Refractory Metals for VLSI Refractory Applications, pp. 331–340.

(Continued)

*Primary Examiner*—Erik Kielin

(57) ABSTRACT

The adhesion of tungsten to an underlying dielectric layer is improved by the use of a thin glue layer of either TiN or Al.

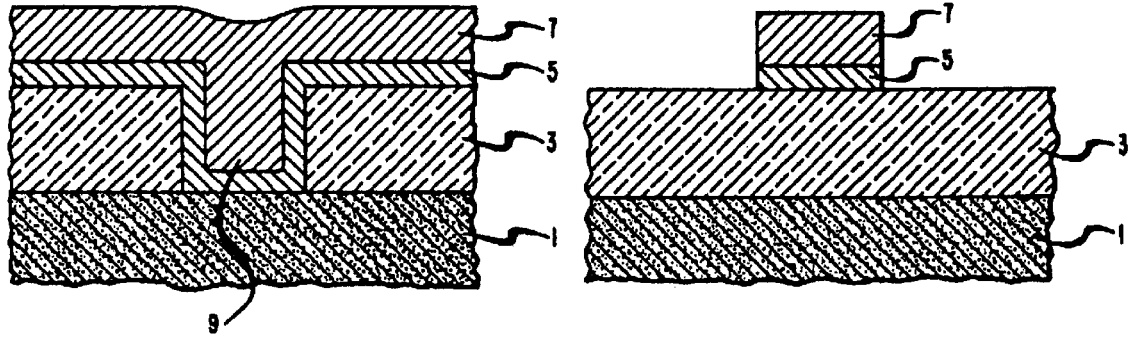

U.S. PATENT DOCUMENTS

| | | | |
|---|---|---|---|
| 3,881,242 A | 5/1975 | Nuttal et al. | |
| 3,885,855 A | 5/1975 | Gross | |
| 3,906,540 A | 9/1975 | Hollins | |
| 3,922,467 A | 11/1975 | Pinchon | |
| 4,066,037 A | 1/1978 | Jacob | |
| 4,080,719 A | 3/1978 | Wilting | |
| 4,104,086 A | 8/1978 | Bondur et al. | |
| 4,121,240 A | 10/1978 | Katto | |
| 4,139,442 A | 2/1979 | Bondur et al. | |
| 4,141,022 A | 2/1979 | Sigg et al. | |
| 4,148,939 A | 4/1979 | Korjukin et al. | |
| 4,153,518 A | 5/1979 | Holmes et al. | |
| 4,180,596 A | 12/1979 | Crowder et al. | |
| 4,209,357 A | 6/1980 | Gorin et al. | |
| 4,226,932 A | 10/1980 | Ferraris | |
| 4,263,088 A | 4/1981 | Gorin | |
| 4,264,393 A | 4/1981 | Gorin et al. | |
| 4,268,711 A | 5/1981 | Gurev | |
| 4,273,812 A | 6/1981 | Tsutsui et al. | |
| 4,282,268 A | 8/1981 | Priestley et al. | |
| 4,315,960 A | 2/1982 | Ohji et al. | |
| 4,319,395 A | 3/1982 | Lund et al. | |
| 4,340,462 A | 7/1982 | Koch | |
| 4,356,211 A | 10/1982 | Riseman | |
| 4,357,195 A | 11/1982 | Gorin | |
| 4,365,405 A | 12/1982 | Dickman et al. | |
| 4,394,678 A | 7/1983 | Winchell, II et al. | |
| 4,398,335 A | 8/1983 | Lehrer | |
| 4,412,885 A | 11/1983 | Wang et al. | |
| 4,436,582 A | 3/1984 | Saxena | |
| 4,439,270 A | 3/1984 | Powell et al. | |
| 4,445,266 A | 5/1984 | Mai et al. | |
| 4,446,815 A | 5/1984 | Kalbskopf et al. | |
| 4,463,265 A | 7/1984 | Owen et al. | |
| 4,464,223 A | 8/1984 | Gorin | |
| 4,476,623 A | 10/1984 | El-Kareh | |
| 4,487,652 A | 12/1984 | Almgren | |
| 4,488,166 A | 12/1984 | Lehrer | |
| 4,491,860 A | 1/1985 | Lim | |
| 4,502,209 A | 3/1985 | Eizenberg et al. | |
| 4,506,435 A | 3/1985 | Pliskin et al. | |
| 4,507,851 A | 4/1985 | Joyner et al. | |
| 4,509,161 A | 4/1985 | Van de Leest et al. | |
| 4,513,905 A | 4/1985 | Nowicki et al. | |
| 4,517,225 A | 5/1985 | Broadbent | |
| 4,520,041 A | 5/1985 | Aoyama et al. | |
| 4,532,002 A | 7/1985 | White | |
| 4,532,702 A | 8/1985 | Gigante et al. | |
| 4,534,826 A | 8/1985 | Goth et al. | |
| 4,535,000 A | 8/1985 | Gordon | |
| 4,545,116 A | 10/1985 | Lau | |
| 4,545,327 A | 10/1985 | Campbell et al. | |
| 4,551,908 A | 11/1985 | Nagasawa et al. | |
| 4,553,315 A | 11/1985 | McCarty | |
| 4,558,507 A | 12/1985 | Okabayashi et al. | |
| 4,560,421 A | 12/1985 | Maeda et al. | |
| 4,562,640 A | 1/1986 | Widmann et al. | |
| 4,566,026 A | 1/1986 | Lee et al. | |
| 4,570,328 A | 2/1986 | Price et al. | |
| 4,571,819 A | 2/1986 | Rogers et al. | |
| 4,577,395 A | 3/1986 | Shibata | |
| 4,582,563 A | 4/1986 | Hazuki et al. | |
| 4,585,207 A | 4/1986 | Shelton | |
| 4,594,473 A | 6/1986 | Inoue et al. | |
| 4,597,985 A | 7/1986 | Chandross et al. | |
| 4,610,948 A | 9/1986 | Glendinning | |
| 4,614,021 A | 9/1986 | Hulseweh | |
| 4,624,864 A | 11/1986 | Hartmann | |
| 4,629,635 A | 12/1986 | Brors | |
| 4,632,057 A | 12/1986 | Price et al. | |
| 4,641,420 A | 2/1987 | Lee | |
| 4,656,732 A | 4/1987 | Teng et al. | |
| 4,657,628 A | 4/1987 | Holloway et al. | |
| 4,666,737 A | 5/1987 | Gimpelson et al. | |
| 4,671,851 A | 6/1987 | Beyer et al. | |
| 4,675,073 A | 6/1987 | Douglas | |
| 4,675,715 A | 6/1987 | Lepselter et al. | |
| 4,677,739 A | 7/1987 | Doering et al. | |
| 4,679,308 A | 7/1987 | Finn et al. | |
| 4,690,730 A | 9/1987 | Tang et al. | |
| 4,700,465 A | 10/1987 | Sirkin | |
| 4,701,349 A | 10/1987 | Koyanagi et al. | |
| 4,702,936 A | 10/1987 | Maeda et al. | |
| 4,702,967 A | 10/1987 | Black et al. | |
| 4,707,218 A | 11/1987 | Giammarco et al. | |
| 4,708,884 A | 11/1987 | Chandross et al. | |
| 4,709,467 A | 12/1987 | Liu | |
| 4,713,682 A | 12/1987 | Erie et al. | |
| 4,717,449 A | 1/1988 | Erie et al. | |
| 4,717,596 A | 1/1988 | Barbee et al. | |
| 4,720,323 A | 1/1988 | Sato | |
| 4,720,908 A | 1/1988 | Wills | |
| 4,721,689 A | 1/1988 | Chaloux, Jr. et al. | |
| 4,724,169 A | 2/1988 | Keem et al. | |
| 4,732,801 A | 3/1988 | Joshi | |
| 4,743,564 A | 5/1988 | Sato et al. | |
| 4,751,101 A | 6/1988 | Joshi | |
| 4,753,709 A | 6/1988 | Welch et al. | |
| 4,755,480 A | 7/1988 | Yau et al. | |
| 4,761,560 A | 8/1988 | Glendinning | |
| 4,764,484 A | 8/1988 | Mo | |
| 4,767,724 A | 8/1988 | Kim et al. | |
| 4,769,686 A | 9/1988 | Horiuchi et al. | |
| 4,772,571 A | 9/1988 | Scovell et al. | |
| 4,773,355 A | 9/1988 | Reif et al. | |
| 4,782,380 A | 11/1988 | Shankar et al. | |
| 4,783,248 A | 11/1988 | Kohlhase et al. | |
| 4,784,719 A | 11/1988 | Schutz | |
| 4,784,973 A | 11/1988 | Stevens et al. | |
| 4,788,160 A | 11/1988 | Havemann et al. | |
| 4,789,648 A | 12/1988 | Chow et al. | |
| 4,795,722 A | 1/1989 | Welch et al. | |
| 4,800,177 A | 1/1989 | Nakamae | |
| 4,804,560 A | 2/1989 | Shioya et al. | |
| 4,804,636 A | 2/1989 | Groover, III et al. | |
| 4,809,052 A | 2/1989 | Nishioka et al. | |
| 4,814,041 A | 3/1989 | Auda | |
| 4,814,244 A | 3/1989 | Koguchi et al. | |
| 4,816,115 A | 3/1989 | Horner et al. | |
| 4,821,085 A | 4/1989 | Haken et al. | |
| 4,824,802 A | 4/1989 | Brown et al. | |
| 4,825,278 A | 4/1989 | Hillenius et al. | |
| 4,826,709 A | 5/1989 | Ryan et al. | |
| 4,829,363 A | 5/1989 | Thomas et al. | |
| 4,832,789 A | 5/1989 | Cochran et al. | |
| 4,837,051 A | 6/1989 | Farb et al. | |
| 4,845,050 A | 7/1989 | Kim et al. | |
| 4,845,054 A | 7/1989 | Mitchener | |
| 4,861,729 A | 8/1989 | Fuse et al. | |
| 4,872,947 A | 10/1989 | Wang et al. | |
| 4,873,204 A | 10/1989 | Wong et al. | |
| 4,884,123 A | 11/1989 | Dixit et al. | |
| 4,887,146 A | 12/1989 | Hinode | |
| 4,892,753 A | 1/1990 | Wang et al. | |
| 4,906,593 A | 3/1990 | Shioya et al. | |
| 4,910,578 A | 3/1990 | Okamoto | |
| 4,924,295 A | 5/1990 | Kuecher | |
| 4,931,311 A | 6/1990 | Singh et al. | |
| 4,939,105 A | 7/1990 | Langley | |
| 4,944,836 A | 7/1990 | Beyer et al. | |
| 4,956,313 A | 9/1990 | Cote et al. | |

| | | |
|---|---|---|
| 4,960,732 A | 10/1990 | Dixit et al. |
| 4,962,063 A | 10/1990 | Maydan et al. |
| 4,966,865 A | 10/1990 | Welch et al. |
| 4,966,870 A | 10/1990 | Barber et al. |
| 4,983,543 A | 1/1991 | Sato et al. |
| 4,992,136 A | 2/1991 | Tachi et al. |
| 5,000,113 A | 3/1991 | Wang et al. |
| 5,006,916 A | 4/1991 | Wills |
| 5,008,730 A | 4/1991 | Huang et al. |
| 5,010,032 A | 4/1991 | Tang et al. |
| 5,013,691 A | 5/1991 | Lory et al. |
| 5,040,046 A | 8/1991 | Chabbra et al. |
| 5,045,904 A | 9/1991 | Kobayashi et al. |
| 5,063,175 A | 11/1991 | Broadbent |
| 5,084,413 A | 1/1992 | Fujita et al. |
| 5,124,014 A | 6/1992 | Foo et al. |
| 5,141,897 A | 8/1992 | Manocha et al. |
| 5,164,333 A | 11/1992 | Schwalke et al. |
| 5,175,126 A | 12/1992 | Ho et al. |
| 5,202,287 A | 4/1993 | Joshi et al. |
| 5,227,335 A | 7/1993 | Holschwandner et al. |
| 5,240,505 A | 8/1993 | Iwasaki et al. |
| 5,250,467 A | 10/1993 | Somekh et al. |
| 5,278,099 A | 1/1994 | Maeda |
| 5,300,460 A | 4/1994 | Collins et al. |
| 5,302,539 A | 4/1994 | Haken et al. |
| 5,302,555 A | 4/1994 | Yu |
| 5,332,691 A | 7/1994 | Kinoshita et al. |
| 5,342,652 A | 8/1994 | Foster et al. |
| 5,354,715 A | 10/1994 | Wang et al. |
| 5,356,476 A | 10/1994 | Foster et al. |
| 5,362,526 A | 11/1994 | Wang et al. |
| 5,370,739 A | 12/1994 | Foster et al. |
| 5,397,742 A | 3/1995 | Kim |
| 5,414,301 A | 5/1995 | Thomas |
| 5,565,157 A | 10/1996 | Sugimoto et al. |
| 5,628,829 A | 5/1997 | Foster et al. |
| 5,633,200 A | 5/1997 | Hu |
| 5,679,606 A | 10/1997 | Wang et al. |
| 5,716,888 A | 2/1998 | Lur et al. |
| 5,760,475 A | 6/1998 | Cronin et al. |
| 5,937,323 A | 8/1999 | Orczyk et al. |
| 5,968,610 A | 10/1999 | Liu et al. |
| 6,087,257 A | 7/2000 | Park et al. |
| 6,444,028 B2 | 9/2002 | Frauenknecht et al. |

FOREIGN PATENT DOCUMENTS

| | | | |
|---|---|---|---|
| JP | 57-208161 A | 12/1982 |
| JP | 57-211269 A | 12/1982 |
| JP | 58-080872 A | 5/1983 |
| JP | 58-101454 A | 6/1983 |
| JP | 59-003978 A | 1/1984 |
| JP | 59-111362 A | 6/1984 |
| JP | 59-130426 A | 7/1984 |
| JP | 59-168666 | 9/1984 |
| JP | 59-181571 | 10/1984 |
| JP | 59-198734 A | 11/1984 |
| JP | 59-217339 A | 12/1984 |
| JP | 59-231836 A | 12/1984 |
| JP | 60-005560 A | 1/1985 |
| JP | 60-101930 A | 6/1985 |
| JP | 60-119755 A | 6/1985 |
| JP | 60-148165 A | 8/1985 |
| JP | 60-157237 A | 8/1985 |
| JP | 60-201649 A | 10/1985 |
| JP | 60-249320 A | 12/1985 |
| JP | 61-032544 A | 2/1986 |
| JP | 61-067245 A | 4/1986 |
| JP | 61-133646 A | 6/1986 |
| JP | 61-147549 A | 7/1986 |
| JP | 61-150236 A | 7/1986 |
| JP | 61-152076 A | 7/1986 |
| JP | 61-172351 A2 | 8/1986 |
| JP | 61-174767 A | 8/1986 |
| JP | 61-187345 A | 8/1986 |
| JP | 61-210180 A | 9/1986 |
| JP | 61-271854 A | 12/1986 |
| JP | 61-296764 A | 12/1986 |
| JP | 62-043175 | 2/1987 |
| JP | 62-118525 A | 5/1987 |
| JP | 62-206852 A | 9/1987 |
| JP | 62-219945 A | 9/1987 |
| JP | 62-243326 A | 10/1987 |
| JP | 62-290128 A | 12/1987 |
| JP | 63-021857 A | 1/1988 |
| JP | 63-036547 A | 2/1988 |
| JP | 63-040323 A | 2/1988 |
| JP | 63-047946 A | 2/1988 |
| JP | 63-062228 A | 3/1988 |
| JP | 63-124527 A | 5/1988 |
| JP | 63-137481 A | 6/1988 |
| JP | 63-288046 A | 11/1988 |
| JP | 63-288406 A | 11/1988 |
| JP | 64-053573 | 1/1989 |
| JP | 64-032627 | 2/1989 |
| JP | 1094657 A | 4/1989 |
| JP | 1-138730 A | 5/1989 |
| JP | 1138780 A | 5/1989 |
| JP | 1304725 A | 12/1989 |
| JP | 4042952 A | 2/1992 |
| JP | 57-053960 A | 3/1992 |
| JP | 04-120725 | 4/1992 |
| JP | 4142061 A | 5/1992 |
| JP | 4142062 A | 5/1992 |
| JP | 4-288824 | 10/1992 |
| JP | 5003170 A | 1/1993 |
| JP | 5003171 A | 1/1993 |
| JP | 6-260607 A | 9/1994 |

OTHER PUBLICATIONS

Tang et al., "VLSI Local Interconnect Level Using Titanium Nitride", Semiconductor Process and Design Center, Texas Instruments Incorporated, IEDM, 1985 IEEE, pp. 590–593.

Tanikawa et al., "Doped oxide films by chemical vapor deposition in an evacuated system", Denki Kagaku, 41, No. 7, 1971, pp. 491–497.

Taubenblatt et al., "Characterization of Native Contamination Layers at Refractory Metal–Silicon Interfaces and Effects on Electrical and Metallurgical Properties", 1985 Materials Research Society, Tungsten and Other Refractory Metals for VLSI Refractory App., pp. 187–195.

Teal et al., "BPSG as Interlevel Dielectric for Double–Level Metal Process", 1985 Proceedings Second International IEEE VLSI Multilevel Interconnect Conference, IEEE Catalog No. 85CH2197–2, Jun. 25–26, 1985, Santa Clara, CA., pp. 273–279.

Terada et al., "Advanced DMOS Memory Cell Using Trench Isolation", *1982 Symposium of VLSI Technology*, Sep. 1–3, 1982, 4 pages.

Thomas et al., "Tungsten–Nitrogen Layers Deposited by Reactive Sputtering as Diffusion Barriers Between Aluminum and Silicon", 1988 Materials Research Society, Tungsten and Other Refractory Metals for VLSI Applications III, Proceedings of the 1987 Workshop, pp. 281–285.

Ting et al., "The Use of TISi2 For Self Aligned Silicide (Salicide) Technology", 1985 Proceedings Second International IEEE VLSI Multilevel Interconnection Conference, Santa Clara, CA, IEEE Catalog No. 86CH2197–4, Jun. 25–26, 1985, pp. 307–318.

Ting et al., "The Use of Titanium–Based Contact Barrier Layers in Silicon Technology", Paper Presented at the International Conference on Metallurgical Coatings and Process Technology, San Diego, CA, Apr. 5–8, 1982, pp. 327–345.

Ting et al., "Using Titanium Nitride and Silicon Nitride for VLSI Contacts", IBM Technical Disclosure Bulletin, Sep. 1981, p. 1976.

Ting, "Method of Preparing TiN Thin Films", IBM Technical Disclosure Bulletin, May 1982, p. 6272.

Ting, "New Structure for Contact Metallurgy", IBM Technical Disclosure Bulletin, May 1983, p. 6398.

Ting, "Silicide for Contacts and Interconnects", IEDM, 1984, pp. 110–113.

Ting, "TiN Formed by Evaporation as a Diffusion Barrier Between Al and Si", Journal of Vacuum Science & Technology, vol. 2, May/Jun. 1982, pp. 14–18.

Townsend, "Control of Hillocks in Al–2% Cu Double Level Metal Interconnect", 1985 Proceedings Second International IEEE VLSI Multilevel Interconnect Conference, IEEE Catalog No. 85CH2197–2, Jun. 25–26, 1985, Santa Clara, CA., pp. 76–82.

Tracy, "The Influence of Deposition Variable on LPCVD Tungsten Films Deposited by the WF6/Si Reduction Reaction", 1985 Materials Research Society, Tungsten and Other Refractory Metals for VLSI Applications, Proceedings of the 1985 Workshop held Oct. 7–9, pp. 211–219.

Trammel, "Application of Tungsten in Silicide Interconnect", 1985 Proceedings Second International IEEE VLSI Multilevel Interconnect Conferernce, IEEE Catalog No. 85CH2197–2, Jun. 25–26, 1985, Santa Clara, CA., pp. 319–323.

Tsang et al., "CVD Hydophobic lead silicate films", Journal of the Electrochemical Society, Jan.–Mar. 1982, No. 1–3, pp. 165–172.

Tsao et al., "LPCVD of Tungsten on Polycrystalline and Single Crystal Silicon Via the Silicon Reduction", 1985 Materials Research Society, Tungsten and Other Refractory Metals for VLSI Refractory Applications, pp. 443–450.

Tseitlin et al., "On changing mechanical stress in chemical vapour deposited SIO2 by Ion bombardment and heat treatment", Nuclear Instruments & Methods in Physics Research, Sect. B, 19–20B, 1987, pp. 931–933.

Tseng et al., "Investigations of Silicon Lattice Damage and its influence on the Electrical Properties of Contacts After Selective Tungsten Deposition", 1988 Materials Research Society, Tungsten and Other Refractory Metals for VLSI Refractory Applications IIII, pp. 299–309.

Tsunoda, "Considerations on the stress effects in the As–doped oxide film roughening", Jap. Journal of Appl. Phys., vol. 17, No. 12, Decmber 1978,, pp. 2085–2089.

Tsunoda, "Effect of atmosphere on arsenic diffusion in silicon", Japan J. Applied Phys., vol. 13 (1974), No. 11, pp. 1901–1902.

Tsunoda, "Effect of heating rate on film roughening in As–doped oxide", J. Appl. Phys., vol. 24 (1985) No. 3, 2 pages.

Tsunoda, "Effect of stress on film roughening in As–doped Oxide", Japan J. Appl. Phys., vol. 16 (1977), No. 10, pp. 1869–1870.

Tsuzuki et al., "The Selective CVD Tungsten for Bipolar Multilevel Interconnection", 1987 Materials Research Society, Tungsten and Other Refractory Metals for VLSI Applications II, Proceedings of the 1986 Workshop held Nov. 12–14, 1986, Palo Alto, CA, pp. 257–264.

Tuckerman, "Pulsed Laser Planarization of Metal Films for Multilevel Interconnects", 1985 Proceedings Second International IEEE VLSI Multilevel Interconnect Conference, IEEE Catalog No. 85CH2197–2, Jun. 25–26, 1985, Santa Clara, CA., pp. 24–31.

Tzuang et al., "Pulse Transmission in an Interconnection Line on a Semiconductor Substrate with a Lossy Layer", 1985 Proceedings Second International IEEE VLSI Multilevel Interconnect Conference, IEEE Catalog No. 85CH2197–2, Jun. 25–26, 1985, Santa Clara, CA, pp. 424–433.

Van Der Putte, "Growth of selective tungsten on self–aligned CoSi2 by low pressure chemical vapor deposition", 1987 Materials Research Society, Tungsten and Other Refractory Metals for VLSI Applications II, Proceedings of the 1986 Workshop held Nov. 12–14, 1986, Palo Alto, CA, 1987, pp. 101–107.

Van Der Putte, "The reaction kinetics of the H2 Reduction of WF6 in the chemical vapor deposition of tungsten films", 1987 Materials Research Society, Tungsten and Other Refractory Metals for VLSI Applications II, Proceedings of the 1986 Workshop held Nov. 12–14, 1986, Palo Alto, CA, 1987, pp. 77–84.

Van Dijk et al., "A Two–Level Metallization System with Oversized Vias and TiW Etch Barrier", 1985 Proceedings Second International IEEE VLSI Multilevel Interconnect Conference, IEEE Catalog No. 85CH2197–2, Jun. 25–26, 1985, Santa Clara, CA., pp. 123–130.

Vance, "Manufacturing of High Purity Metal Fluorides", 1985 Materials Research Society, Tungsten and Other Refractory Metals for VLSI Refractory Applications, pp. 453–456.

Vines, "Interlevel Dielectric Planarization with Spin On Glass Films", 1985 Proceedings Second International IEEE VLSI Multilevel Interconnect Conference, IEEE Catalog No. 85CH2197–2, Jun. 25–26, 1985, Santa Clara, CA., pp. 506–515.

Vogel et al., "Electrical Properties of 10–50 nm TEOS LPCVD Films" Technical Report, Defense Technical Information Center, Aug. 24, 1984, 37 pages.

Vogel et al., "Electrical properties of 200–500A LPCVD SiO2 films", Abstract No. 193, Extended Abstracts, vol. 82–2, Fall Meeting, Detroit, MI, Oct. 17–21, 1982, pp. 305–306.

Vogel et al., "Electrical properties of silicon dioxide films fabricated at 700 degrees celcius", J. Electron. Mat., vol. 14, No. 3, 1985, pp. 329–342.

Wade, "Polymides for Use as VLSI Multilevel Interconnect Dielectric and Passivation Layer", VLSI Seminar, 1985, pp. 321–367.

Wade, "Proposed Comprehensive Test Vehicle for Monitoring Multilevel Interconnection Process Variabilities, Misalignment, Parametrics and Defect Density", 1986 Proceedings Third International IEEE VLSI Multilevel Interconnect Conference, IEEE Catalog No. 86, pp. 354–361.

Walker et al., "Analysis of a Metal Etch Plasma Process", 1986 Proceedings Third International IEEE VLSI Multilevel Interconnect Conference, IEEE Catalog No. 86CH2337–4, Jun. 9–10, 1986, Santa Clara, CA., pp. 225–231.

Walter, "Implications of a Two Dimensional Description of Electromigration in Aluminum", 1986 Proceedings Third International IEEE VLSI Mulitlevel Interconnect Conference, IEEE Catalog No. 86CH2337–4, Jun. 9–10, 1986, Santa Clara, CA., pp. 173–180.

Wang et al., "Advanced CVD Technology", ULSI Science and Technology, Proceedings of the First International Symposium on Ultra Large Scale Integration Science and Technology, 1987, pp. 712–722.

Whitwell, "The Performance and processing of a New Spin–On Polysiloxane Interlevel Dielectric Material", 1986 Proceedings Third International IEEE VLSI Multilevel Interconnect Conference, Santa Clara, CA, IEEE Catalog No. 86CH2337–4, Jun. 9–10, 1986, pp. 292–297.

Williams et al., "Filament Growth During LPCVD of Refractory Metals and Silicides", 1985 Materials Research Society, Tungsten and Other Refractory Metals for VLSI Refractory Applications, pp. 125–131.

Wilson et al., "Highly Selective, High Rate Tungsten Deposition", 1985 Materials Research Society, Tungsten and Other Refractory Metals for VLSI Refractory Applications, pp. 35–42.

Wilson et al., "Highly Selective, High Rate W Deposition for Via Filling", 1985 Proceedings Second International IEEE VLSI Multilevel Interconnect Conference, IEEE Catalog No. 85CH2197–2, Jun. 25–26, 1985, Santa Clara, CA., pp. 343–349.

Wilson, "Report on Informal Discussion Session on the Kinetics of the CVD Growth of the W on W by the Hydrogen Reduction of Tungsten Hexafluoride", 1985 Materials Research Society, Tungsten and Other Refractory Metals for VLSI Refractory Applications, pp. 221–222.

Winters, "The Interaction of Fluorine Compounds With Tungsten and Silicon", 1985 Materials Research Society, Tungsten and Other Refractory Metals for VLSI Applications, Proceedings of the 1985 Workshop held Oct. 7–9, 1985, Albuquerque, NM, pp. 83–92.

Wittmer, "High–Temperature Contact Structures for Silicon Semiconductor Devices", 1980 American Institute of Physics, Applied Physics Letter 37(6), Sep. 15, 1980, pp. 540–542.

Wittmer, "Interfacial Reactions Between Aluminum and Transition–Metal Nitride and Carbide Films", Journal of Applied Physics, vol. 53, No. 2, Feb. 1982, pp. 1006–1012.

Wittmer, "Properties and Microelectronic Applications of Thin Films of Refractory Metal Nitrides", 1985 American Vacuum Society, Journal of Vacuum Science Technology, vol.3, No. 4, Jul.–Aug. 1985, pp. 1797–1803.

Wittmer, "TiN and TaN as diffusion barriers in metallizations to silicon semiconductor devices", Appl. Phys. Lett., vol. 36 No. 6, Mar. 15, 1980, pp. 456–458.

Wittmer, Barrier Layers—Principles and applications in Microelectronics, 1984 American Vacuum Society, Journal of Vacuum Science Technology, vol. 2, No. 2, Apr.–Jun. 1984, pp. 273–280.

Wohleiter et al., "High production system for the deposition of silicon dioxide", Abstract No. 180, Extended Abstracts, vol. 75–1, Spring Meeting Toronto, Canada, May 11–16, 1975, pp. 424–425.

Wolf et al., "Silicon Processing for the VLSI Era", 1990, pp. 268–273, Lattice Press, Sunset Beach, CA, pp. 268–273.

Woodruff et al., "Adhesion of Non–Selective CVD Tungsten to Silicon Dioxide", 1985 Materials Research Society, pp. 173–183.

Woodruff et al., "CVD Molybdenum from MoF6", 1987 Materials Research Society, Tungsten and Other Refractory Metals for VLSI Applications II, Proceedings of the 1986 Workshop held Nov. 12–14, 1986, Palo Alto, CA, 1987, pp. 207–213.

Wu, "The Manufacturability of a Dual Layer Metal MOS Process for VLSI Circuits", 1985 Proceedings Second International IEEE VLSI Multilevel Interconnection Conference, Santa Clara, CA, IEEE Catalog No. 85CH2197–2, Jun. 25–26, 1985, pp. 145–153.

Yachi et al., "Use of TiSi2 to form metal–oxide–silicon field effect transistors with self–aligned source/drain and gate electrode", J. Vac. Sci. Technol. (1985), pp. 992–996.

Yamada et al., "A deep–trenched capacitator technology for 4 mega bit dynamic ram", IEDM 85, 1985 IEEE, pp. 702–705.

Yamamoto et al., "Characteristics of Tungsten Gate Devices for MOS VLSIs", 1985 Materials Research Society, Tungsten and Other Refractory Metals for VLSI Refractory Applications, pp. 297–311.

Yanai et al., "Comparison Between CVD and Sputtered Polycide Films", 1985 Proceedings Second International IEEE VLSI Multilevel Interconnect Conference, IEEE Catalog No. 85CH2197–2, Jun. 25–26, 1985, Santa Clara, CA., pp. 516–522.

Yao et al., "Metal Step Coverage Improvement in Double Level Metal with Oxide Spacers", 1985 Proceedings Second International IEEE VLSI Multilevel Interconnect Conference, IEEE Catalog No. 85CH2197–2, Jun. 25–26, 1985, Santa Clara, CA., pp. 38–44.

Yarmoff et al., "Chemical Vapor Deposition of Tungsten on Silicon Studied with Soft X–Ray Photoemsiion", 1988 Materials Research Society, Tungsten and other refractory metals for VLSI Applications III, Proceedings of the 1987 Workshop held Oct. 7–9, 1987, NY, pp. 87–94.

Yonei et al., "Performance Sturdies on a New Two–Phase Small–Geometry Buried–Channel CCD by Computer Simulation", 1986 Proceedings Third International IEEE VLSI Multilevel Interconnect Conference, IEEE Catalog No. 86CH2337–4, Jun. 9–10, 1986, Santa Clara, CA, pp. 274–280.

Yu et al., "A Study on the Reaction of WF6 with Si(100) Surfaces", 1988 Materials Research Society, Tungsten and Other Refractory Metals for VLSI Refractory Applications III, pp. 75–81.

Yuzuriha et al., "Failure Mechanisms in a 4 Micron Pitch 2–Layer Gold IC Metallization Process", 1986 Proceedings Third International IEEE VLSI Multilevel Interconnect Conference, IEEE Catalog No. 86CH2337–4, Jun. 9–10, 1986, Santa Clara, CA, pp. 146–152.

Petersson, "Metallization in VLSI Technology", Proceedings of the Fifth European Conference on Chemical Vapour Deposition, Jun. 17–20, 1985, Uppsala, Sweden, pp. 5–10, 439–440.

Pliskin et al., "Structural Evaluation of Silicon Oxide Films", Electrochemical Society Journal, Jul.–Dec. 1965, vol. 112, No. 10, pp. 1013–1019.

Pliskin, "Comparison of properties of dielectric films deposited by various methods", J. Vac. Sci. Technol., vol. 14, No. 5, Sep./Oct. 1977, pp. 1064–1081.

Poisson et al., "Via Contact Dry Etching Using a Plasma Low Resistance Photoresist", 1986 Proceedings Third International IEEE VLSI Multilevel Interconnection Conference, IEEE Catalog No. 86CH2337–4, Jun. 9–10, 1986, Santa Clara, CA, Jun. 9–10, 1986, pp. 308–318.

Rajapakse et al., "Focused Ion Beam Repair for Thick Film Multilayer Wafer Scale Interconnections", 1986 Proceedings Third International IEEE VLSI Multilevel Interconnect Conference, IEEE Catalog No. 86CH2337–4, Jun. 9–10, 1986, Santa Clara, CA., pp. 362–371.

Rana et al., "Thin Layers of TiN and A1 AS Glue Layers for Blanket Tungsten Deposition", Tungsten and Other Refractory Metals for VLSI Applications II, Proceedings of the 1986 Workshop held Nov. 12–14, 1986, Palo Alto, CA, 1987, pp. 187–195.

Rand, "Plasma–promoted deposition of thin organic films", J. Vac. Sci. Technol., vol. 16, No. 2, Mar./Apr. 1979, pp. 420–427.

Rao et al., "Analysis of Multiconductor Systems and Multilayer Dielectrics", 1985 Proceedings Second International IEEE VLSI Multilevel Interconnect Conference, IEEE Catalog No. 85CH2197–2, Jun. 25–26, 1985, Santa Clara, CA., pp. 416–423.

Raupp, "CVD Reactor Design", 1988 Materials Research Society, Tungsten and Other Refractory Metals for VLSI Refractory Applications III, pp. 15–24.

Ray et al., "Development and Application of a Plasma Planarization Process", 1985 Proceedings Second International IEEE VLSI Multilevel Interconnect Conference, IEEE Catalog No. 85CH2197–2, Jun. 25–26, 1985, Santa Clara, CA., pp. 52–59.

Rebenne et al., "The sensitivity of CVD calculations to physical property values", J. Electrochem. Soc., Aug. 1986, pp. 1932.

Reents, Jr. et al., "Gas Phase Analysis of WF6", 1988 Materials Research Society, Tungsten and Other Refractory Metals for VLSI Refractory Applications III, pp. 151–158.

Rey et al., "A Double Level Aluminum Interconnection Technology with Spin on Glass Based Insulator", 1986 Proceedings Third International IEEE VLSI Multilevel Interconnect Conference, IEEE Catalog No. 86CH2337–4, Jun. 9–10, 1986, Santa Clara, CA., pp. 491–499.

Rey et al., "Technological Performance of Al 2 wt % Cu and Al 2 wt % Ti Deposited on Ti: W", 1985 Proceedings Second International IEEE VLSI Multilevel Interconnection Conference, Santa Clara, CA, IEEE Catalog No. 85CH2197–2, Jun. 25–26, 1985, pp. 63–75.

Rhoades et al., "Characterization of an Al Plasma Etching System Using Fractional Factorial Experimental Designs", 1986 Proceedings Third International IEEE VLSI Multilevel Interconnect Conference, IEEE Catalog No. 86CH2337–4, Jun. 9–10, 1986, Santa Clara, CA, pp. 219–224.

Robinson et al., "A Simple Inteconnect Delay Model for Multilayer Integrated Circuits", 1986 Proceedings Third International IEEE VLSI Multilevel Interconnect Conference, IEEE Catalog No. 86CH2337–4, Jun. 9–10, 1986, Santa Clara, CA., pp. 267–273.

Roland, "Device Reliability when Using Tungsten Interconnects", 1987 Materials Research Society, Tungsten and Other Refractory Metals for VLSI Refractory Applications II, pp. 419–421.

Roland, "Two–Layer Refractory Metal IC Process", Hewlett–Packard Journal, Aug. 1983, pp. 30–32.

Roland, "Two–Layer Tungsten Interconnect", Hewlett Packard, Fort Collins, IC Division, 1984 Workshop, 1985 Materials Research Society, Tungsten and Other Refractory Metals for VLSI Applications, Proceedings of the 1985 Workshop held Oct. 7–9, 1985, Albuquerque, pp. 536–538.

Root et al., "Electromigration Failure and Fine Line Conductors Under Pulse Test Conditions", 1985 Proceedings Second International IEEE VLSI Multilevel Interconnect Conference, IEEE Catalog No. 85CH2197–2, Jun. 25–26, 1985, Santa Clara, CA., pp. 180–186.

Rosser et al., "Self Aligned Nitridation of TiSi2—A TiN–TiSi2 Contact Structure", 1985 Materials Research Society, Tungsten and Other Refractory Metals for VLSI Refractory Applications, pp. 607–612.

Rossi et al., "VLSI Multilayer Circuits Using W–CVD Interconnections and Photo–Enhanced CVD of Sio2 Dielectric Layers", 1984 Proceedings First International, IEEE VLSI Multilevel Interconnection Conference, Jun. 21–22, 1984, pp. 259–267.

Rossnagel, Stephen et al., "Handbook of Plasma Processing Technology", (1990), Noyes Publications, Park Ridge, NJ, 47 pages.

Rothman et al., "Lift–Off Process to Form Planar Metal–Sputtered SiO2 Structures", 1985 Proceedings Second International IEEE VLSI Multilevel Interconnect Conference, IEEE Catalog No. 85CH2197–2, Jun. 25–26, 1985, Santa Clara, CA., pp. 131–137.

Sachdev et al., "Blanket Tungsten Applications in VLSI Processing", 1985 Materials Research Society, Tungsten and Other Refractory Metals for VLSI Refractory Applications, pp. 475–482.

Sachdev et al., "CVD Tungsten and Tungsten Silicide for VLSI Applications", Semiconductor International, May 1985, pp. 1–5.

Sachdev et al., "Tungsten Interconnects in VLSI", 1985 Materials Research Society, Tungsten and Other Refractory Metals for VLSI Applications, Proceedings of the 1985 Workshop held Oct. 7–9, 1985, Albuquerque, NM, and the 1984 Workshop, pp. 161–171.

Sahin et al., "Low pressure chemical vapor deposition of molybdenum: 1. Kinetics and reaction mechanisms", 1987 Materials Research Society, Tungsten and Other Refractory Metals for VLSI Applications II, Proceedings of the 1986 Workshop held Nov. 12–14, 1986, Palo Alto, CA, 1987, pp. 199–205.

Saia et al., "Reactive ion etching of refractory metals for gate and interconnect applications", 1987 Materials Research Society, Tungsten and Other Refractory Metals for VLSI Applications II, Proceedings of the 1986 Workshop held Nov. 12–14, 1986, Palo Alto, CA, 1987, pp. 349–356.

Saito et al., "TiW as a Barrier Metal for Small Contacts", 1987 Materials Research Society, Tungsten and Other Refractory Metals for VLSI Applications II, Proceedings of the 1986 Workshop held Nov. 12–14, 1986, Palo Alto, CA, 1987, pp. 319–324.

Sanchez, "Mechanisms for whisker growth in thin films", 1987 Materials Research Society, Tungsten and Other Refractory Metals for VLSI Applications II, Proceeding of the 1986 Workshop held Nov. 12–14, 1986, Palo Alto, CA, 1987, pp. 395–399.

Saraswat et al., "Measurement and Extraction of Specific Contact Resistivity", 1986 Proceedings Third International IEEE VLSI Multilevel Interconnect Conference, IEEE Catalog No. 86CH2337–4, Jun. 9–10, 1986, Santa Clara, CA., pp. 385–405.

Saraswat et al., "Selective CVD Tungsten for VLSI Technology", Proceedings Second International Symposium of VLSI, 1984, pp. 409–419.

Joshi et al., "LPCVD Tungsten Silicide with Titanium Underlayer", 1986 Symposium on VLSI Technology, IEEE Catalog No. 86CH2318–4, May 28–30, 1986, San Diego, CA., pp. 53–54.

Joshi et al., "Microstructure of Deposited Refractory Metals", 1988 Materials Research Society, Tungsten and Other Refractory Metals for VLSI Refractory Applications III, pp. 183–188.

Kaanta et al., "Submicron Wiring Technology with Tungsten and Planarization", IEDM Technical Digest: International Electron Devices Meeting (33rd), Washington, D.C., 1987, IEEE 87CH2515–5, pp. 209–212.

Kanamori, "Investigation of Reactively Sputtered TiN Films for Diffusion Barriers", Proceedings of the 28th Symposium on Semiconductors and Integrated Circuits Technology, Jun. 1985, pp. 97–102, partial English translation.

Kasemset et al., "GaAs MSI Integrated Optoelectronics Circuits for High–Speed Interconnect Applications", 1985 Proceedings Second International IEEE VLSI Multilevel Interconnect Conference, IEEE Catalog No. 85CH2197–2, Jun. 25–26, 1985, Santa Clara, CA., pp. 225–233.

Kazi et al., "High Resolution On–Chip Measurement Test Structure for Embedded Array Evaluation", 1986 Proceedings Third International IEEE VLSI Multilevel Interconnect Conference, IEEE Catalog No. 86CH2337–4, Jun. 9–10, 1986, Santa Clara, CA., pp. 341–353.

Kemlage, "Elimination of chlorine in LPCVD—SiO2", IBM Technical Disclosure Bulletin, vol. 23, No. 5, Oct. 1980, p. 1879.

Kermani et al., "Electrical Characteristics of PtSi Schottky Diodes Formed By Conventional Furnace and Rapid Thermal Processing", 1988 Materials Research Society, Tungsten and Other Refractory Metals for VLSI Refractory Applications III, pp. 339–345.

Kern, "Inorganic Dielectric Systems for VLSI Multilevel Interconnections", VLSI Multilevel Interconnection Conference, Short Course Session, Jun. 24, 1985, Santa Clara, CA, pp. 213–320.

Kern, "Pertinent Inorganic and Organic Dielectric Systems for Multilevel Interconnection", Visuals Booklet, 1986 VLSI Multilevel Interconnection State–Of–The–Art Seminar, Santa Clara, CA, Jun. 11, 1986, pp. 119–235.

Khan et al., "Semi Planarization Process for Multilevel Interconnect Technology", 1985 Proceedings Second International IEEE VLSI Multilevel Interconnect Conference, IEEE Catalog No. 85CH2197–2, Jun. 25–26, 1985, Santa Clara, CA., pp. 32–37.

Murarka, "Recent Advances in Silicide Technology", *Solid State Technology*, Sep. 1985, pp. 181–185.

Murarka, "Refractory Sillicides for Integrated Curcuits", 1980 American Vacuum Society, Journal of Vacuum Science Technology, vol. 17, No. 4, Jul.–Aug. 1980, pp. 775–792.

Murarka, Silicides for VLSI Applications, 1983, pp. 1–200, Academic Press, New York, NY.

Nagy, "Sidewall Tapering in Reactive Ion Etching", *Journal of the Electrochemical Society*, 1985, pp. 689–693.

Ng et al., "Interaction of CVD Tungsten with Underlying Metal Layers", 1987 Materials Research Society, Tungsten and Other Refractory Metals for VLSI Applications II, Proceedings of the 1986 Workshop held Nov. 12–14, 1986, Palo Alto, CA, 1987, pp. 93–99.

Nguyen et al., "Plasma organosilicon polymers", J. Electrochem. Soc., vol. 132, No. 8, Aug. 1985, pp. 1925–1931.

Bassous et al., "Topology of Silicon Structure with Recessed SiO2", *Journal of the the Electrochemical Society*, vol. 123, No. 11, Nov. 1976, pp. 1729–1737.

Bergendahl et al., "A Flexible Approach for Generation of Arbitary Etch Profiles in Multilayer Films", *Solid State Technology*, Nov. 1984, pp. 107–112.

Bogle–Rohwer et al., "Wall Profile Control In a Triode Etcher", *Solid State technology*, Apr. 1985, pp. 251–255.

Bondur et al., "Plasma Etching for SiO2 Profile Control", *Solid State technology*, Apr. 1980, pp. 122–128.

Bose et al., "Advanced Inter–Metal Dielectric Deposition—A Comparative Analysis between ECR–CVD and O3/TEOS", Jun. 8–9 *VMIC Conference* (1993), pp. 89–95.

Bothra et al., "Control of Plasma Damage to Gate Oxide during High Density Plasma Chemical Vapor Deposition", *J. Electrochem. Society*, vol. 142, No. 11, Nov. 1984, pp. L208–L211.

Busta et al., "Film Thickness Dependence of Silicon Reduced LPCVD Tungsten on Native Oxide Thickness", *Journal of The Electrochemical Society*, vol. 133, No. 6, Jun. 1986, pp. 1195–1200.

Chambers, "The Application of Reactive Ion Etching to the Definition of Patterns in Al–Si–Cu Alloy Conductor Layers and Thick Silicon Oxide Films", *Solid State Technology*, Jan. 1983, pp. 83–86.

Chang et al., "The Reliability Improvement on Self–Aligned Contact CMOS by Optimizing Poly Etching", *IEEE/CPMT Int'l Electronics Manufacturing Technology Symposium* (1998), pp. 136–138.

Charles et al., "Characterization of silicon dioxide films deposited at low pressure and temperature in helicon diffusion reactor", *J. Vac. Sci. Technol. A* 11(6), Nov./Dec. 1993, pp. 2954–2963.

Charles et al., "SiO2 deposition from oxygen/silane pulsed helicon diffusion plasmas", *American Physics Letters* 67 (1), Jul. 3, 1995, pp. 40–42.

Chen et al., "TiSi2 Thickness Limitations for with Use with Shallow Junctions and SWAMI or LOCOS Isolation", *IEEE Transactions on Electron Devices*, vol. ED–33, No. 10, Oct. 1986, pp. 1463–1468.

Chin et al., "Plasma TEOS Process for Interlayer Dielectric Applications", *Solid State Technology*, Apr. 1988, pp. 119–122.

Chiu et al., "A Bird's Beak Free Local Oxidation Technology Feasible for VSLI Circuits Fabrication", IEEE *Transactions on Electron Devices*, vol. ED–29, No. 4, Apr. 1982, pp. 536–540.

Clark et al., "High Pressure Blanket CVD Tungsten", *Mat. Res. Soc. Symp. Proc. VLSI V*, 1990, pp. 167–179.

Cote et al., "Low temperature chemical vapor deposition processes and dielectrics for microelectronic circuit manufacturing at IBM", *IBM J. Res. Develop.*, vol. 39, No. 4, Jul. 1995, pp. 437–464.

Cote et al., "Plasma–assisted chemical vapor deposition of dieletric thin films for ULSI Semiconductor Circuits", *IBM J. Res. Develop.*, vol. 43, No. 1/2, Jan./Mar. 1999, pp. 5–38.

Davari et al., "A Variable–Size Shallow Trench Isolation (STI) Technology with diffused Sidewall Doping for Submicron CMOS", *International Electron Devices Meeting Digest* (1988), pp. 92–95.

Ding et al., "In situ Dielectric Etch Process Technology for Advanced Leading Edge Production Worthy Etch Applications", *IEEE/SEMI Advanced Semiconductor Manufacturing Conference* (1999), pp. 161–163.

Dixit et al., "A reactively sputtered coherent TiN process for sub–0.5 um technology", *SPIE vol. 2090 Multilevel Interconnection*, (1993), pp. 12–21.

Ehara et al., "Perfect Planar Technology for VLSIs", 1982 *Symposium on VLSI Technology, Digest of Technical Papers*, Sep. 1–3, 1982, pp. 30–31.

Forester et al., "Development of A Three layer Metal Back-end Process for Application to a Submicron CMOS Logic Process", Jun. 12–13, 1990 VMIC Conf., pp. 28–34.

Fuji et al., "A Planarization Technology Using a Bias–Deposited Dielectric Film and an Etch–Back Process", *IEEE Transctions on Electron Devices*, vol. 35, No. 11, Nov. 1988, pp. 1829–1833.

Fuse et al., "Indirect trench sidewall doping by implantation of reflected ions", *Appl. Phys. Lett.*, 54 (16), Apr. 17, 1989, pp. 1534–1536.

Fuse et al., "Trench Isolation with Boron Implanted Side–Walls for Controlling Narrow–Width Effect of n–MOS Threshold Voltages", *1985 Symposium on VLSI Technology: Digest of Technical Papers*, May 14–16, 1985, pp. 58–59.

Fuse, "Development of Ion–Implantation Technology Accelerating the Debut of 64M–Bit DRAMs", JEE, Oct. 1988, pp. 104–107.

Gelatos et al., "Optimization of Tungsten and Titanium Nitride Etchback for Contact and via Plug Applications", *Conference Proceedings ULSI–VIII Material Research Society* (1993), pp. 365–374.

Goto et al., "An Isolation Technology for High Performance Bipolar Memories—IOP–II", IEDM 82, IEEE (1982), pp. 58–62.

Graf et al., "Highly Selective Oxide to Nitride Etch Processes on BPSG/Nitride/Oxide Structures in MERIE Etcher", *IEEE/SEMI Advanced Semiconductor Manufacturing Conference* (1998), pp. 314–319.

Green et al., "The Formation and Structure of CVD W Films Produced by the Si Reduction of WF6", *J. Electrochemical Soc. Solid State Science and Technology*, vol. 134, No. 9, Sep. 1987, pp. 2285–2292.

Hayasaka et al., "U–Groove Isolation Technique for High Speed Bipolar VLSI's", IEDM 82, IEEE (1982), pp. 62–69.

Herner et al., "Homogeneous Tungsten Chemical Vapor Deposition on Silane Pretreated Titanium Nitride", *Electrochemical and Solid–State Letters* 2(8) 398–400 (1999).

Herner et al., "Volcano Reactions in Oxide Vias Between Tungsten CVD and Bias Sputtered TiN/Ti Films", *Journal of Electrochemical Society* 147 (5) 1982–1987, (2000).

Hieda et al., "New Effects of Trench Isolated Transistor Using Side–Wall Gates", 736–IEDM, IEEE (1987), pp. 736–740.

Hinson et al., "Magnetron–Enhanced Plasma Etching of Silicon & Silicon Dioxide", *Semiconductor International*, Oct. 1983, pp. 103–107.

Hitchner et al., "Polymide Layers Having Tapered Via Holes", *IBM Technical Disclosure Bulletin*, IBM Corp., vol. 20. No. 4, Sep. 1977, 2 pages.

Hori et al., "A New p–Channel MOSFET with Large–Tilt–Angle Implanted Punchthrough Stopper (LATIPS)", *IEEE Electron Device Letters*, vol. 9, No. 12, Dec. 1988, pp. 641–643.

Inouo et al., "FAM 16.6: A 16Mb DRAM with An Open Bit–Line Architecture", *ISSCC*, Feb. 19, 1988, 3 pages.

Ireland, "High aspect ratio contacts: A review of the current tungsten plug process", *Thin Solid Films* 304 (1997) 1–12.

Jiang et al., "Radio–frequency bias effects on SiO2 films deposited by distributed electron cyclotron resonance plasma enhanced chemical vapor deposition", *J. Appl. Phy.* 76 (3), Aug. 1, 1994, pp. 1847–1855.

Jones et al., "Characterization of Si distribution at the tungsten/titanium nitride interface using secondary ion mass spectrometry—an investigation of the dynamic response of a chemical vapor deposition chamber", *Applied Surface Science* 165 (2000), 154–158.

Joshi et al., "Collimated Sputtering of TiN/Ti liners into sub–half–micrometer high aspect ratio contacts/lines", *Appl. Phys. Letters* 61 (21) Nov. 23, 1992, 6 pages.

Kajikawa et al., "Nucleation of W during Chemical Vapor Deposition form WF6 and SiH4", *Japanese Journal of Applied Physics*, vol. 43, No. 6B, 2004, pp. 3945–3950.

Kalnynya et al., "Some property change in pyrolitic SiO2 films after thermal treatment", Foreign Technology Division, edited translation FTD–HT–23–5–70, 1970, 10 pages.

Kanamaori et al., "High–Reliability Microwave Silicon Power Transistor with Stepped Electrode Structure and TiN Diffusion Barrier", IEEE *Transactions on Electron Devices*, vol. ED–33, No. 3, Mar. 1986, pp. 402–405.

Kaneko et al., "Novel Submicrometer MOS Devices by Self–Aligned Nitridation of Silicide", *IEEE Transactions on Electron Devices*, vol. ED–33, No. 11, Nov. 1986, pp. 1702–1703.

Kato et al., "Gap filling mechanism in SiO film deposition by using bias ECR CVD system", Feb. 10–11 DUMIC Conference (1997), pp. 67–70.

Kim et al., "Application of high density plasma CVD to 1 Gbit DRAM for ILD", Jun. 10–12 VMIC Conference (1997), pp. 623–625.

Kim et al., "Characterization of the HDP–CVD Oxide as Interlayer Dielectric Materials for Sub–quarter Micron CMOS", IITC 98, IEEE (1998), pp. 274–276.

Kobayashi et al., "Study on mechanism of selective chemical vapor deposition of tungsten using in situ infrared spectroscopy and Auger electron spectroscopy", *J. Appl. Phys.*, 69 (2), Jan. 15, 1991, pp. 1013–1019.

Kotecki et al., "Hydrogen incorporation in silicon nitride films deposited by remote electron–cyclotron–resonance chemical vapor deposition", *J. Appl. Phys.* 77 (3) Feb. 1, 1995, pp. 1284–1293.

Lai et al., "Design and Characteristics of a Lightly Doped Drain (LDD) Device Fabricated with Self–Aligned Titanium Disilicide", IEEE *Transactions on Electron Devices*, vol. ED–33, No. 3, Mar. 1986, pp. 345–353.

Lee et al., "Sub–Atmospheric Chemical Vapor Deposition (SACVD) of Teos–Ozone USG and BPSG", Jun. 12–13 VMIC Conf. (1990), pp. 396–398.

Lee et al., "The Optimization of Passivation Layout Structure for Reliability Improvement of Memory Devices", *Jpn. J. Appl. Phys.*, vol. 35 (1996), pp. 5462–5465.

Machida et al., "Si02 planarization technology with biasing and electron cyclotron resonance plasma deposition for submicron interconnections", *J. Vac. Sci. Technol. B*, 4 (4), Jul./Aug. 1986, pp. 818–821.

Maeda et al., "CVD TEOS/O3: Development history and applications", *Solid State Technology*, Jun. 1993, pp. 83–88.

Marangon et al., "Nucleation and growth of CVD–W on TiN studied by X–ray fluorescence spectrometry", *Applied Surface Science*, 91 (1995) 157–161.

Matsuo et al., "Low Temperature Chemical Vapor Deposition Method Utilizing an Electron Cyclotron Resonance Plasma", *Japanese Journal of Applied Physics,* vol. 22, No. 4, Apr. 1983, pp. L210–L212.

Mogami et al., "SiO2 planarization by two–step rf bias–sputtering", *J. Vac. Sci. Technol. B,* 3 (3), May/Jun. 1985, pp. 857–861.

Mucha, "The Gases of Plasma Etching: Silicon–Based Technology", *Solid State technology,* Mar. 1985, pp. 123–127.

Murugesh et al., "Process Window Characterization of Ultima™ HDP–CVD Low Dielectric FSG Films", Feb. 10–11 DUMIC Conference (1997), pp. 387–394.

Nagayoushi et al., "SiNx:H/SiO2 Double–Layer Passivation With Hydrogen–Radical Annealing For Solar Cells", *Jpn. J. Appl. Phys.,* vol. 36 (1997), pp. 5688–5692.

Nguyen et al., "Characterization of High Density Plasma Deposited Silicon Oxide Dielectric for 0.25 Micron ULSI", Jun. 27–29 VMIC Conference (1995), pp. 69–75.

Nguyen et al., "The Characterization of Electron Cyclotron Resonance Plasma Deposited Silicon Nitride and Silicon Oxide Films", *J. Electrochem. Soc.,* vol. 136, No. 10, Oct. 1989, pp. 2835–2840.

Nguyen, "Plasma assisted chemical vapor deposited thin films for microelectronic applications", *J. Vac. Sci. Technol. B,* 4 (5), Sep./Oct. 1986, pp. 1159–1167.

Ohto et al., "MOCVD–TIN Barrier Layer for Blanket W–CVD", Conference Proceedings ULSI–VIII Material Research Society (1994), 81 pages.

Pal, "Planarization for 0.5um CMOS/BiCMOS Technology", Jun. 12–13 VMIC Conf. (1990), pp. 450–452.

Paleau, "Chemical Vapor Deposition of Tungsten Films For Metallization of Integrated Circuits" 1984 in *Thin Solid Films* vol. 122 at pp. 243–258.

Paulson et al., "Manufacturable Triple Level Metal Technology for Submicron CMOS", Jun. 12–13 VMIC Conf. (1990), pp. 407–409.

Peccoud et al., "Oxide Contact Windows Profiing In a Single Confined Discharge Structure", Extended Abstracts (1984), Abstract No. 389, pp. 554–555.

Pennington et al., "A Low Temperature In–SITU Deposition and Planarizing Phosphosilicate Glass Process for Filing High–Aspect–Ratio Topography", Jun. 12–13 VMIC Conf. (1990), pp. 71–75.

Pennington et al., "An Improved Interlevel Dielectric Process for Submicron Double–Level Metal Products", Jun. 12–13 VMIC Conf. (1989), pp. 355–359.

Pramanik, Influence of the Interfacial Oxide on Titanium Silicide Formation by Rapid Thermal Annealing, Journal of Vacuum Science Technology, Oct.–Dec. 1984, pp. 775–780.

Robertson et al., "Proximity effects and influences of non-uniform illumination in projection lithography", *Optical Microlithography—Technology for mid–1980s,* edited by Harry Stover, Proceedings of the SPIE–The International Society for Optical Engineering, (Mar. 1982), 9 pages.

Rung et al., "Deep Trench Isolated CMOS Devices", International Electron Devices Meeting, San Francisco, CA, Dec. 13–15, 1982, pp. 237–243.

Ryan et al., "The Evolution of Interconnection Technology at IBM", *IBM J. Res. Develop.,* vol. 39, No. 4, Jul. 4, 1995, pp. 371–381.

Sala et al., "Dry Etching of Tapered Contact Holes Using Multilayer Resist", *Journal of the Electrochemical Society: Solid–State Science and Technology,* Aug. 1985, pp. 1954–1957.

Saxena, (Moderator) Panel Discussion of Pressing Problems and Future Trends, Visuals Booklet, 1986 VLSI Multilevel Interconnection State–Of–The Art Seminar, Santa Clara, CA, Jun. 11, 1986.

Schwalka et al., "Effects of Contact Hole Filing and Multilevel Metalization on Gate Oxide Integrity and Transistor Performance", Jun. 12–13 VMIC Conf. (1990), pp. 113–119.

Sherman, "Plasma–Assisted Chemical Vapor Deposition Processes and Their Semiconductor Applications", *Thin Solid Films,* 113 (1984) 135–149.

Shibata et al., "A Novel Zero–Overlap/Enclosure Metal Interconnection Technology For High Density Logic VLSI's", Jun. 12–13 VMIC Conf. (1990), pp. 15–21.

Shibata et al., "A Simplified Box (Buried–Oxide) Isolation Technology for Megabit Dynamic Memories", International Electron Devices Meeting, Washington, DC, Dec. 5–7, 1983, pp. 27–30.

Singer et al., "The Future of Dielectric CVD: High Density Plasmas?", *Semiconductor International* Jul. 1997, pp. 126–134.

Sinha, "Interconnect Materials Technology for VLSI", Proceedings of the 1st Int'l. Symposium on Very Large Scale *Integration Science and Technology, VLSI Science and Technology* (1982), pp. 173–193.

SpitzIsperger et al., "New Process Flow for combined Three Layer and Self Aligned Contacts", *IEEE/SEMI Advanced Semiconductor Manufacturing Conference* (2001), pp, 67–70.

Suzuki et al., "Low Temperature Interlayer Formation Technology Using a New Siloxane Polymer Films", Jun. 12–13 VMIC Conf. (1990), pp. 173–179.

Swann et al., "The Preparation and Properties of Thin Flim Silicon–Nitrogen Compounds Produced by a Radio Frequency Glow Discharge Reaction", *J. Electrochem. Soc.: Solid State Science,* Jul. 1967, pp. 713–717.

Thornton, "Plasma–Assisted Deposition Processes: Theory, Mechanisms, and Applications", *Thin Solid Films,* 107 (1983), 3–19.

Ueno et al., "A Quarter–Micron Planartzed Interconnection Technology with Self–Aligned Plug", IEEE (1992), IEDM 92, pp. 305–308.

Vossen, "Control of Film Properties by rf–sputtering techniques", Proceedings of the Symposium on New Developments in Film and Device Fabrication, *The Journal of Vacuum Science and Technology,* vol. 8, No. 5, Sep./Oct. 1971, pp. S12–S30.

Wang et al., "Enhanced Self Aligned Contact SAC ETCH Stop Window by Using C4F6 Chemistry", *IEEE/SEMI Advanced Semiconductor Manufacturing Conference* (2001), pp. 101–105.

Weiss, "Plasma Etching of Oxide and Nitrides", *Semiconductor International,* Feb. 1983, vol. 6, No. 2, pp. 56–62.

Whitwer et al., "A Submicron, Double Level Metal Process for High Density Memory Applications", Jun. 12–13 VMIC Conf. (1990), pp. 49–54.

Wilson et al., "Highly Selective, High Rate Tungsten Deposition Using 'Hot Plate' Wafer Heating", 1988 Materials Research Society, Tungsten and Other Refractory Metals for VLSI Refractory Applications III, pp. 311–316.

Wong et al., "The Effects of Chemical Oxide on the Deposition of Tungsten by the Silicon Reduction of Tungsten Hexafluoride", *Journal of the Electrochemical Society,* vol. 134, No. 9, Sep. 1987, pp. 2339–2345.

Yanagisawa et al., "Trench Transistor Cell With Self-Aligned Contact (TSAC) for Megabit MOS DRAM", 1st LSI Division NEC Corp. IEEE (1986), IEDM 86, 6 pages.

Yoshida et al., "Source/Drain Area Shrinkage Using A Novel Contact And Interconnect Technology for CMOS Application", Jun. 12–13 VMIC Conf. (1990), pp. 35–41.

Yota et al., "Planarity Characterization of ICP High Density Plasma CVD and CMP for 0.35um CMOS Technology", Conf. Proceedings ULSI XXII, Material Research Society (1997), pp. 597–601.

Yu et al., "Comparative Study of PE–BPSG and HDP–PSG as PMD for O.25um Memory Device", IITC 99, IEEE (1999), pp. 35–37.

Yu et al., Surface reactions in the chemical vapor deposition of tungsten using WF6 and SiH4 on Al, PtSi, and TiN, *J. Appl. Phys.,* 67 (2), Jan. 15, 1990, pp. 1055–1061.

Aboaf, "Stresses in SiO2 films obtained from the thermal decomposition of tetrathylorthosilicate—Effect of heat-treatment and humidity", J. Electrochem. Soc., Dec. 1989, vol. 116, No. 12, pp. 1732–1736.

Abraham, "Sidewall Tapering of Plasma Etched Metal Interconnects", 1986 Proceedings Third International IEEE VLSI Multilevel Interconnect Conference, IEEE Catalog No. 86CH2337-4, Jun. 9–10, 1986, Santa Clara, CA., pp. 198–204.

Adams, "Plasma–assisted deposition of dielectric films", Proceedings of the Symposium on Reduced Temperature Processing For VLSI, vol. 86–5, The Electrochemical Society, Inc, 1986, pp. 111–131.

Ahn et al., "Deposition Characteristics of Tungsten Films in a Cold–Wall Single–Wafer LPCVD System", 1988 Materials Research Society, Tungsten and Other Refractory Metals for VLSI Refractory Applications III, pp. 25–37.

Ahn et al., "Investigation of TiN Films Reactively Sputtered Using a Sputter Gun", Thin Solid Films, 1983, pp. 45–55.

Ahn et al., "Metal–diffusion Barrier Composite in the Polycide Process", IBM Technical Disclosure Bulletin, Mar. 1986, 1 page.

Ahn et al., "Properties of Molybdenum Films Prepared by High–Rate Magnetron Sputtering from High–Purity Target", 1988 Materials Research Society, Tungsten and Other Refractory Metals for VLSI Refractory Applications III, pp. 317–326.

Ahn et al., "Properties of Tungsten Films Prepared by Magnetron Sputtering", 1985 Materials Research Society, Tungsten and Other Refractory Metals for VLSI Refractory Applications, pp. 239–248.

Aitchison et al., "The Effect of Chromyl Fluoride (CrO2F2) on Selective Tungsten Deposition Processes", 1987 Materials Research Society, Tungsten and Other Refractory Metals for VLSI Applications III, Proceedings of the 1987 Workshop held Oct. 7–9, 1987, pp. 171–179.

Aitchison et al., "Tungsten Hexafluoride: Its Physiochemical Properties and Their Relevance to VLSI Process Applications", 1985 Materials Research Society, Tungsten and Other Refractory Metals for VLSI Applications, Proceedings of the 1985 Workshop, pp. 225–231.

Alt et al., "Low–Temperature Deposition of Silicon Oxide Films", *Journal of The Electrochemical Society* (1963), 2 pages.

Amick, "Deposition techniques for dielectric films on semiconductor devices", *J. Vac. Sci. Technol.,* vol. 14, No. 5, Sep./Oct. 1977, pp. 1053–1063.

Applied Materials Product Information Bulletin, "CVD Systems", dated Jan. 1983, 4 pages.

Arai et al., "Structural changes of arsenic silicate glasses with heat treatments", Japanese Journal of Applied Physics, vol. 9, No. 6, 1970, pp. 691–704.

Arai et al., "Water adsorption on chemically vapor–deposited glass films", Jap. Journal of Appl. Phys. Suppl. 2, Pt. 1, 1974, Proceedings of the 6th International Vacuum Congress held Mar. 25–29, 1974, Kyoto Japan, pp. 757–760.

Arena et al., "Geometrical Effect of the Thermal Behavior of Selective Tungsten–Silicon Interface", 1985 Materials Research Society, Tungsten and Other Refractory Metals for VLSI Refractory Applications, pp. 483–487.

Armstrong et al., "Development of Low–Resistance Contacts in VLSI Using 2–D Simulation", 1985 Proceedings Second International IEEE VLSI Multilevel Interconnect Conference, IEEE Catalog No. 85CH2197-2, Jun. 25–26, 1985, Santa Clara, CA., pp. 389–398.

Ashwell et al., "The Reflow of Arsenosilicate Glass", 1985 Proceedings Second International IEEE VLSI Multilevel Interconnection Conference, Santa Clara, CA, IEEE Catalog No. 86CH2197-4, Jun. 25–26, 1985, pp. 285–291.

Aumann et al., "Resistivity and Growth of TiSi2 Films for Different Process Parameters", 1985 Proceedings Second International IEEE VLSI Multilevel Interconnect Conference, IEEE Catalog No. 85CH2197-2, Jun. 25–26, 1985, Santa Clara, CA., pp. 363–372.

Author Unknown, "Dry oxygen tetraethyl ortho silicate anneal", IBM Technical Disclosure Bulletin, vol. 27, No. 12, May 1985, p. 7252.

Author Unknown, Introduction: "LPCVD W Used as an Interconnect Metal Provides the Following Advantages over Al–Si Alloys", 1984 Workshop, pp. 488–496.

Bacci et al., "Electrical Characterization and Electromigration Performances of AlSi–TiN–Ti Metallization Scheme", 1988 Materials Research Society, Tungsten and Other Refractory Metals for VLSI Refractory Applications III, pp. 293–297.

Baker et al., "Via Profiling by the Flow of Polyimide", 1986 Proceedings Third International IEEE VLSI Multilevel Interconnection Conference, Santa Clara, CA, Jun. 9–10, 1986, IEEE Catalog No. 86CH2337-4, pp. 500–505.

Baker, "The Transient Reflow of Phospho– and Borophospho–Silicate Glasses", 1986 Proceedings Third International IEEE VLSI Multilevel Interconnection Conference, Santa Clara, CA, IEEE Catalog No. 86CH2337-4, Jun. 9–10, 1986, pp. 484–490.

Balagurov et al., "Comparison of refractive indices and IR spectra of silicon dioxide films produced by different methods", Sov. J. Opt. Technol., 46 (2), Feb. 1979, pp. 100–101.

Barton et al., "Fine Pitch Two–Level Metal for a 1.3 Micron CMOS Process", 1986 Proceedings Third International IEEE VLSI Multilevel Interconnect Conference, IEEE Catalog No. 86CH2337-4, Jun. 9–10, 1986, Santa Clara, CA, pp. 52–57.

Basi et al., "Carbon–free SiO2 films", IBM Technical Disclosure Bulletin, vol. 26, No. 4, Sep. 1983, pp. 1980–1982.

Basi et al., "Plasma–oxide–filled deep dielectric isolation", IBM Technical Disclosure Bulletin, vol. 25, No. 8, Jan. 1983, pp. 4405–4406.

Becker et al., "A new LPCVD borophosphosilicate glass process based on the doped deposition of TEOS–oxide", abstract No. 254, Extended Abstracts, The Electrochemical Society, vol. 85–2, Fall Meeting, Las Vegas, NV, Oct. 13–18, 1985, pp. 380–381.

Becker et al., "Process and film characterization of low pressuretetraethylorthosilicate–borophosphosilicate glass", J. Vac. Sci. Technol. B 4 (3), May/Jun. 1986, pp. 732–744.

Beinglass et al., "Selective CVD Tungsten Deposition—A New Technology for VLSI and Beyond", 1985 Materials Research Society, Tungsten and Other Refractory Metals for VLSI Refractory Applications, pp. 13–20.

Bergendahl et al., "A Thick Film Lift–off Technique for High Frequency Interconnection in Wafer Scale Integration", 1985 Proceedings Second International IEEE VLSI Multilevel Interconnect Conference, IEEE Catalog No. 85CH2197–2, Jun. 25–26, 1985, Santa Clara, CA, pp. 154–162.

Beyers et al., "Phase Equilibria in Thin–Film Metallizations", 1987 American Vacuum Society, Journal of Vacuum Science Technology, Nov.–Dec. 1987, pp. 781–784.

Binder et al., "Doping of trench capacitators for 4 megabit DRAMs", Extended Abstracts of the 18th (1986 International) Conference on Solid State Devices and Materials, Aug. 20–22, 1986, Tokyo, pp. 299–302.

Blewer et al., "Conditions for Tunnel Formation in LPCVD Tungsten Films on Single Crystal Silicon", 1985 Materials Research Society, Tungsten and Other Refractory Metals for VLSI Refractory Applications, pp. 115–122.

Blewer et al., "Detrimental Effects of Residual Silicon Oxides on LPCVD Tungsten Depositions in Shallow Junction Devices", 1987 Materials Research Society, Tungsten and Other Refractory Metals for VLSI Refractory Applications II, pp. 235–246.

Blewer et al., "Suppression of the Silicidation Reaction Between LPCVD Tungsten Films and Silicon up to 1100oC", 1985 Materials Research Society, Tungsten and Other Refractory Metals for VLSI Applications, Proceedings of the 1985 Workshop held Oct. 7–9, 1985, Albuquerque, NM, pp. 53–62.

Blewer et al., "Thick Selective LPCVD Tungsten: Techniques and Characteristics", 1985 Materials Research Society, Tungsten and Other Refractory Metals for VLSI Applications, Proceedings of the 1985 Workshop held Oct. 7–9, 1985, Albuquerque, NM, pp. 407–422.

Blewer et al., "Tungsten Deposition in Porous Silicon for the Formation of Buried Layer Conductors", 1987 Materials Research Society, Tungsten and Other Refractory Metals for VLSI Applications II, Proceedings of the 1986 Workshop held Nov. 12–14, 1986, pp. 401–407.

Blewer, "Current Developments in Refractory Metal Systems", Visuals Booklet, 1986 VLSI Multilevel Interconnection State–Of–The–Art Seminar, Jun. 11, 1986, pp. 236–338.

Blewer, "Progress in LPCVD Tungsten for Advanced Microelectronics Applications", Solid State Technology, Nov. 1986, pp. 117–126.

Blewer, "Refractory Metal Systems (With Emphasis On LPCVD Tungsten)", VLSI Multilevel Interconnection Conference Short Course Presentation, Center for Radiation Hardened Microelectronics, Jun. 24, 1985, pp. 129–209.

Blumenthal et al., "Step Coverage in Coldwall–Deposited Blanket CVD Tungsten Films", 1988 Materials Research Society, Tungsten and Other Refractory Metals for VLSI Refractory Applications III, pp. 47–54.

Bonifield et al., "A One Micron Design Rule Double Level Metallization Process", 1986 Proceedings Third International IEEE VLSI Multilevel Interconnect Conference, IEEE Catalog No. 86CH2337–4, Jun. 9–10, 1986, Santa Clara, CA, pp. 71–77.

Bradbury et al., "Nucleation of CVD Tungsten Films on Insulators and Reaction with Silicon Surfaces", 1985 Materials Research Society, Tungsten and Other Refractory Metals for VLSI Refractory Applications, p. 207, abstract.

Brader et al., "A Planarising Spacer Technique for Multilevel Metallisation", 1986 Proceedings Third International IEEE VLSI Multilevel Interconnect Conference, IEEE Catalog No. 86CH2337–4, Jun. 9–10, 1986, Santa Clara, CA., pp. 93–99.

Blewer et al., "Thick Tungsten Films in Multilayer Conductor Systems: Properties and Deposition Techniques", 1984 Proceedings First International IEEE VLSI Multilevel Interconnection Conference, IEEE Catalog No. 84CH 1999–2, Jun. 21–22, 1984, pp. 153–158.

Blewer et al., "Tungsten and Other Refractory Metals for VLSI Applications", Proceedings of the 1985 Workshop held Oct. 7–9, 1985, Albuquerque, NM, and 1984 Workshop held Nov. 12–13, 1984, Albuquerque, NM, pp. 1–571.

Brader et al., "Scaled PECVD Oxide as an Interlayer Dielectric for CMOS DLM Processing", 1986 Proceedings Third International IEEE VLSI Multilevel Interconnect Conference, IEEE Catalog No. 86CH2337–4, Jun. 9–10, 1986, Santa Clara, CA., pp. 58–64.

Brassington et al., "An Advanced Single–Level Polysilicon Submicrometer BICMOS Technology", IEEE Transactions on Electronic Devices, vol. 36, No. 4, Apr. 1989, pp. 712–719.

Breiland et al., "Fundamental Mechanisms of CVD", 1985 Materials Research Society, Tungsten and Other Refractory Metals for VLSI Refractory Applications, pp. 519–524.

Broadbent et al., "Electromigration–Induced Short Circuit Failure In Aluminum–Tungsten (CVD) Conductors", 1987 Materials Research Society, Tungsten and Other Refractory Metals for VLSI Refractory Applications II, pp. 247–255.

Broadbent et al., "Growth of Selective Tungsten on Self–Aligned TI and TnNI Silicides by Low Pressure Chemical Vapor Deposition", 1985 Materials Research Society, Tungsten and Other Refractory Metals for VLSI Refractory Applications, pp. 63–79.

Broadbent et al., "High Density, High Reliability Tungsten Interconnection by Filled Interconnect Groove (FIG) Metallization", 1988 Materials Research Society, Tungsten and Other Refractory Metals for VLSI Refractory Applications III, pp. 191–199.

Broadbent et al., "Selective Low Pressure Chemical Vapor Deposition of Tungsten", Journal of Electrochemical Society, Solid–State Science and Technology, Jun. 1984, 1427–1433.

Broadbent et al., "Selective Tungsten Processing by Low Pressure CVD", Solid State Technology, Dec. 1985, pp. 51–59.

Broadbent et al., "Some Recent Observations on Tunnel Defect Formation During High Temperature Post–Deposition Anneal of CVD W on Si", 1988 Materials Research Society, Tungsten and Other Refractory Metals for VLSI Refractory Applications III, pp. 111–113.

Broadbent, "Nucleation and Growth of Chemically Vapor Deposited Tungsten on Various Substrate Materials—A Review", 1987 American Vacuum Society, Journal of Vacuum Science Technology, Nov.–Dec. 1987, pp. 1661–1666.

Broadbent, "The Reaction Kinetics of Selective Tungsten Film Formation by Reduction of WF6", 1985 Materials Research Society, Tungsten and Other Refractory Metals for VLSI Applications, Proceedings of the 1985 Workshop held Oct. 7–9, 1985, Albuquerque, NM, pp. 365–374.

Broadbent, "Tungsten and Other Refractory Metals for VLSI Applications II", Proceedings of the 1986 Workshop held Nov. 12–14, 1986, Palo Alto, CA, 1987, pp. 1–426.

Brors et al., "CVD Tungsten—A Solution for the Poor Step Coverage and High Contact Resistance of Aluminum", Solid State Technology, Apr. 1984, pp. 313–314.

Brown et al., "Selective CVD Tungsten Via Plugs for Multilevel Metallization", International Electron Devices Meeting, Los Angeles, CA., Dec. 7–10, 1986, pp. 66–69.

Bucolo et al., "A Network Analog Technique for the Computation of the VLSI Multilevel Interconnect Parameters", 1985 Proceedings Second International IEEE VLSI Multilevel Interconnect Conference, IEEE Catalog No. 85CH2197–2, Jun. 25–26, 1985, Santa Clara, CA, pp. 234–240.

Bucolo et al., "Analysis and Modeling of Multilevel Parallel and Crossing Interconnection Lines", 1986 Proceedings Third International IEEE VLSI Multilevel Interconnect Conference, IEEE Catalog No. 86CH2337–4, Jun. 9–10, 1986, Santa Clara, CA., pp. 259–266.

Burggraaf, "Plasma deposition production trends", Semiconductor International, Mar. 1980, pp. 23–24, 26, 29–30, 32, 34.

Busta et al., "Film Thickness Dependence of Silicon Reduced LPCVD Deposited Tungsten on Native Oxide Thickness", 1985 Materials Research Society, Tungsten and Other Refractory Metals for VLSI Refractory Applications, pp. 509–523.

Busta et al., "Formation of Thin Tungsten Filaments Via LPCVD", 1985 Materials Research Society, Tungsten and Other Refractory Metals for VLSI Refractory Applications, pp. 533–535.

Busta et al., "Novel Device Applications Employing LPCVD Tungsten", 1985 Materials Research Society, Tungsten and Other Refractory Metals for VLSI Refractory Applications, pp. 283–295.

Chang, "Formation of PtSi in the Presence of Al—Effect of W Barrier Layer", 1988 Materials Research Society, Tungsten and Other Refractory Metals for VLSI Refractory Applications III, pp. 265–270.

Chasset et al., "Statistical Analysis of Planarized Double Metal Structures", 1986 Proceedings Third International IEEE VLSI Multilevel Interconnect Conference, IEEE Catalog No. 86CH2337–4, Jun. 9–10, 1986, Santa Clara, CA., pp. 114–120.

Chatterjee, "Interconnects and VLSI—A Device Designers Perspective", 1985 Materials Research Society, Tungsten and Other Refractory Metals for VLSI Refractory Applications, pp. 3–10.

Chen et al., "Plasma etching of CVD tungsten films for VLSI applications", 1987 Materials Research Society, Tungsten and Other Refractory Metals for VLSI Applications II, Proceedings of the 1986 Workshop held Nov. 12–14, 1986, Palo Alto, CA, 1987, pp. 357–362.

Chen et al., "Refractory Metals and Metal Silicides for VLSI Devices", Solid State Technology, Aug. 1984, pp. 145–149.

Chen, "Device considerations for using tungsten and other refractory matals in CMOS VLSI", 1987 Materials Research Society, Tungsten and Other Refractory Metals for VLSI Applications II, Proceedings of the 1986 Workshop held Nov. 12–14, 1986, Palo Alto, CA, 1987, pp. 9–18.

Chern et al., "Anisotropic Tungsten Polycide Plasma Etching", 1985 Proceedings Second International IEEE VLSI Multilevel Interconnect Conference, IEEE Catalog No. 85CH2197–2, Jun. 25–26, 1985, Santa Clara, CA., pp. 301–306.

Chiu et al., "Adhesion of Blanket Tungsten to Oxide", 1987 Materials Research Society, Tungsten and Other Refractory Metals for VLSI Refractory Applications II, pp. 177–186.

Chow et al., "Selective Tungsten Deposition in a Batch Cold Wall CVD System", 1987 Materials Research Society, Tungsten and Other Refractory Metals for VLSI Refractory Applications II, pp. 137–146.

Chow et al., "Selective Tungsten Plug for CMOS Double and Triple Layer Metal Technology", 1988 Materials Research Society, Tungsten and Other Refractory Metals for VLSI Refractory Applications III, pp. 201–207.

Chu et al., "Spin–on–Glass Dielectrics Planarization for Double Metal CMOS Technology", 1986 Proceedings Third International IEEE VLSI Multilevel Interconnect Conference, IEEE Catalog No. 86CH2337–4, Jun. 9–10, 1986, Santa Clara, CA., pp. 474–483.

Collot et al., "Physicochemical Properties in Tungsten Films Deposited by RF Magnetron Sputtering", 1988 Materials Research Society, Tungsten and Other Refractory Metals for VLSI Refractory Applications III, pp. 327–331.

Constant et al., "Some properties of amorphous SixC1X(H) alloys prepared by CVD from various organosilicon compounds", *Solid State Chemistry*, 1982, Proceedings of the 2nd European Conference, The Netherlands, Jun. 7–9, 1982, pp. 267–270.

Creighton et al., "More Observations on Selectivity Loss During Tungsten CVD", 1988 Materials Research Society, Tungsten and Other Refractory Metals for VLSI Refractory Applications III, pp. 63–68.

Creighton, "Observations on selectivity liss during tungsten CVD", 1987 Materials Research Society held Nov. 12–14, 1986, Palo Alto, CA, 1987, pp. 43–50.

Cresswell et al., "The Use of Artificial Intelligence and Microelectronic Test Structures for Evaluation and Yield Enhancement of Microelectronic Interconnect Systems", 1986 Proceedings Third International IEEE VSLI Multilevel Interconnection Conference, pp. 331–340.

Crowder, "Tungsten and Tungsten Silicides: A View From Manufacturing", 1988 Materials Research Society, pp. 3–12.

Culver et al., "Modeling of Metal Step Coverage for Minimum Feature Size Contacts and Vias", 1985 Proceedings Second International IEEE VLSI Multilevel Interconnect Conference, IEEE Catalog No. 85CH2197–2, Jun. 25–26, 1985, Santa Clara, CA., pp. 399–407.

Davari et al., "Submicron Tungsten Gate Mosfet Using Magnetron Sputtering", 1987 Materials Research Society, Tungsten and Other Refractory Metals for VLSI Applications III, Proceedings of the 1987 Workshop held Oct. 7–9, 1987, Yorktown Heights, NY, 1987, pp. 415–424.

De Geyter et al., "Comparison of Physical Characteristics of Five Different Polyimide Films", 1985 Proceedings Second International IEEE VLSI Multilevel Interconnect Conference, IEEE Catalog No. 85CH2197–2, Jun. 25–26, 1985, Santa Clara, CA., pp. 319–328.

Deal et al., "The Physicas and Chemistry of Thin "Native" Oxide Films on Silicon", 1987 Materials Research Society, Tungsten and Other Refractory Metals for VLSI Applications II, Proceedings of the 1986 Workshop held Nov. 12–14, 1986, Palo Alto, CA, 1987, pp. 27–39.

Deal et al., "Tungsten Silicide/n+ Polysilicon Technologies for VLSI", 1985 Proceedings Second International IEEE VLSI Multilevel Interconnect Conference, IEEE Catalog No. 85CH2197–2, Jun. 25–26, 1985, Santa Clara, CA, Jun. 25–26, 1985, pp. 324–334.

Dell'Oca, "Interconnect Technologies for VLS"I, 1985 Proceedings Second International IEEE VLSI Multilevel Interconnect Conference, IEEE Catalog No. 85CH2197–2, Jun. 25–26, 1985, Santa Clara, CA., pp. 3–14.

Dieleman et al., "Plasma Effluent Etching: Selective and Non–Damaging", *Solid State Technology*, Apr. 1984, pp. 191–197.

Dimaria et al., "Use of composite silicon–rich SiO2 and SiO2 layers or off–stolchio–metric CVD SiO2 layers for improvement of poly 1 to poly 2 dielectric", IBM Technical Disclosure Bulletin, vol. 25, No. 12, May 1983, p. 6417.

Draper et al., "A Hillock–free Conductor System for Use in Multilevel Interconnects", 1985 Proceedings Second International IEEE VLSI Multilevel Interconnect Conference, IEEE Catalog No. 85CH2197–2, Jun. 25–26, 1985, Santa Clara, CA., pp. 90–101.

Dunton, "A Study of Sodium Penetration Through Plasma–Deposited Silicon Oxynitrides", 1985 Proceedings Second International IEEE VLSI Multilevel Interconnect Conference, IEEE Catalog No. 85CH2197–2, Jun. 25–26, Santa Clara, CA., pp. 259–265.

Eggers et al., "A Polymide–Isolated Three–Layer Metallization System for Bipolar Gate Arrays", 1985 Proceedings Second International IEEE VLSI Multilevel Interconnect Conference, IEEE Catalog No. 85CH2197–2, Jun. 25–26, 1985, Santa Clara, CA., pp. 163–169.

Eisele, "Etching of SiO2 in narrowly confined plasma of high–power density", J. Vac. Sci. & Tech., 4 Sep./Oct. 1986, No. 5, 2nd Series, pp. 1227–1232.

Elkins et al., "A Planarization Process for Double Metal CMOS Using Spin–on–Glass as a Sacrificial Layer", 1986 Proceedings Third International IEE VLSI Multilevel Interconnect Conference, IEEE Catalog No. 86CH2337–4, Jun. 9–10, 1986, Santa Clara, CA., pp. 100–106.

Ellwanger et al., "The Contact Properties to TiSi2 and teh Adhesion Within Sub–Micron Contact Holes of Etched Back CVD w/Adhesion Layer Films", 1987 Materials Research Society, Tungsten and Other Refractory Metals for VLSI Applications II, pp. 385–394.

Ellwanger et al., "The Deposition, Contact and Electromigration Properties of Reactively Sputtered Titanium Nitride Films", 1987 Materials Research Society, Tungsten and Other Refractory Metals for VLSI Applications II, pp. 283–290.

Ellwanger et al., "The Effect of SIH4/WF6 and H2/WF6 Chemistries on Underlying Metal Layers", 1988 Materials Research Society, Tungsten and Other Refractory Metals for VLSI Applications III, Proceedings of the 1987 Workshop held Oct. 7–9, 1987, pp. 399–406.

Ellwanger, "Rapid Thermal Annealed Platinum Silicide for Self–Aligned Bipolar Applications", 1986 Proceedings Third International IEEE VLSI Multilevel Interconnect Conference, IEEE Catalog No. 86CH2337–4, Jun. 9–10, 1986, Santa Clara, CA., pp. 457–464.

Esteve et al., "Parasitic Line Capacitance and Contact Resistance Modeling", 1986 Proceedings Third International IEEE VLSI Multilevel Interconnect Conference, IEEE Catalog No. 86CH2337–4, Jun. 9–10, 1986, Santa Clara, CA., pp. 235–241.

Farooq et al., "Tungsten as a Diffusion Barrier Between Cobalt Silicide and Aluminum in Multilayer Metallization Schemes", 1988 Materials Research Society, Tungsten and Other Refractory Metals for VLSI Applications III, pp. 357–364.

Ferry et al., "Interconnection Limitation in VLSI", 1985 Proceedings Second International IEEE VLSI Multilevel Interconnect Conference, IEEE Catalog No. 85CH2197–2, Jun. 25–26, 1985, Santa Clara, CA., pp. 408–415.

Flowers, "Processing Requirements for Multilevel Interconnect Fabrication", 1986 Proceedings Third International IEEE VLSI Multilevel Interconnect Conference, IEEE Catalog No. 86CH2337–4, Jun. 9–10, 1986, Santa Clara, CA., pp. 78–89.

Foster et al., "An In–Situ Phosphorus Doped Polysilicon Deposition Process Optimized for Production", 1986 Proceedings Third International IEEE VLSI Multilevel Interconnect Conference, IEEE Catalog No. 86CH2337–4, Jun. 9–10, 1986, Santa Clara, CA., pp. 523–529.

Foster et al., "High Rate, Low–Temperature Selective Tungsten", 1988 Materials Research Society, Tungsten and Other Refractory Metals for VLSI Refractory Applications III, pp. 69–72.

Foster et al., "Mass Spectrometric Studies on Selectivity Tungsten Deposition—Mechanism and Reliability", 1988 Materials Research Society, Tungsten and Other Refractory Metals for VLSI Refractory Applications III, pp. 159–169.

Foster et al., "Selective Tungsten Deposition in a Varian–Torrex 5101 Cold Wall CVD Reactor", 1987 Materials Research Society, Tungsten and Other Refractory Metals for VLSI Refractory Applications II, pp. 147–155.

Fraser, "Tungsten—A Spectator's View", 1987 Materials Research Society, Tungsten and Other Refractory Metals for VLSI Applications II, Proceedings of the 1986 Workshop held Nov. 12–14, 1986, Palo Alto, CA, 1987, pp. 3–6.

Fritzsche et al., "An Improved Etch–Back Process for Multilevel Metallization and its Reliability Result for CMOS Devices", 1986, pp. 45–51.

Fritzsche et al., "Etching of Tapered Via Holes in Sandwiched Dielectric Layers for Multilevel Metallizations", 1985 Proceedings Second International IEEE VLSI Multilevel Interconnect Conference, IEEE Catalog No. 85CH2197–2, Jun. 25–26, 1985, pp. 253–258.

Fu et al., "Failure Analysis of Titanium Nitride–Titanium Silicide Barrier Contacts Under High Current Stress", 1988 IEEE VLSI Multilevel Interconnect Conference, IEEE Catalog No. 88CH2624–5, Jun. 13–14, 1988, pp. 469–475.

Fuhs et al., "A High Growth Rate LPCVD Tungsten Process for Interconnects & Contact/Via Filling", 1985 Materials Research Society, Tungsten and Other Refractory Metals for VLSI Refractory Applications, pp. 257–266.

Garceau et al., "TiN as a Diffusion Barrier in teh Ti–Pt–Au Beam–Lead Metal System", Thin Solid Films, vol. 60, No. 2, Jun. 15, 1979, pp. 237–247.

Garcia et al., "Patterning of the Polymide Using an Erodible Mask", 1985 Proceedings Second International IEEE VLSI Multilevel Interconnect Conference, IEEE Catalog No. 85CH2197-2, Jun. 25–26, 1985, Santa Clara, CA., pp. 283–291.

Gardner et al., "Homogeneous and Layered Films of Aluminum–Silicon with Titanium for Multilevel Interconnects", 1985 Proceedings Second International IEEE VLSI Multilevel Interconnect Conference, IEEE Catalog No. 85CH2197-2, Jun. 25–26, 1985, Santa Clara, CA, pp. 102–113.

Geiger et al., "An Optimized Planarization Process for a Multi Layer Interconnect", 1986 Proceedings Third International IEEE VLSI Multilevel Interconnect Conference, IEEE Catalog No. 86CH2337-4, Jun. 9–10, 1986, Santa Clara, CA., pp. 128–136.

Georgiou et al., "The Influence of Selective Tungsten Deposition on Shallow Junction Leakage", 1987 Materials Research Society, Tungsten and Other Refractory Metals for VLSI Applications II, Proceedings of the 1986 Workshop held Nov. 12–14, 1986, Palo Alto, CA, pp. 227–234.

Georgiou et al., "Thick Selective Electroless Plated Cobalt Alloy Contacts to Shallow Junctions Below CoSi2", 1988 Materials Research Society, Tungsten and Other Refractory Metals for VLSI Applications III, Proceedings of the 1987 Workshop held Oct. 7–9, pp. 249–256.

Gerault et al., "Mass spectrometric investigation of the thermal decomposition of various organosilicon compounds in SixC1x (H) chemical vapour deposition", *J. Anal. and Appl. Pyrolysis*, 4 (1982) 59–72.

Gerault et al., "X–ray photoelectron spectroscopy and raman spectroscopy investigation of amporphous SixCx(H) coatings obtained by chemical vapur deposition from thermally labile organosilicon compounds", Thin Solid Films, 1983, pp. 83–96.

Ghate, "Major issues of VLSI Multilevel Interconnection Reliability", Visuals Booklet, 1986 VLSI Multilevel Interconnection State–Of–The–Art Seminar, Jun. 11, 1986, pp. 86–117.

Ghate, "Metallization for integrated Circuits", Texas Instruments Incorporated, Dallas, TX, VLSI Seminar, 1985, pp. 57–77.

Gibbons, "Reactive Ion Etching of Sloped Vias in Polymide", 1985 Proceedings Second International IEEE VLSI Multilevel Interconnect Conference, IEEE Catalog No. 85CH2197-2, Jun. 25–26, 1985, Santa Clara, CA., pp. 266–272.

Goodman et al., "Hydrogen Dissociation on Transition Metal Surfaces—The Effects of Surface Impurities", 1985 Materials Research Society, Tungsten and Other Refractory Metals for VLSI Refractory Applications, pp. 93–104.

Goodman et al., "Optical Interconnects—An Overview", 1985 Proceedings Second International IEEE VLSI Multilevel Interconnect Conference, IEEE Catalog No. 85CH2197-2, Jun. 25–26, 1985, Santa Clara, CA., pp. 219–224.

Gorokhov et al., "Preparation of uniform SiO2 films by pyrolysis Tetraethoxysilane", Inorganic Materials F, 12(1), 1–136, 1976, pp. 232–234.

Graf, "Modern Dictionary of Electronics", 1977, p. 185.

Gralenski et al., "Selective and blanket tungsten by APCVD", 1987 Materials Research Society, Tungsten and Other Refractory Metals for VLSI Applications II, Proceedings of the 1986 Workshop held Nov. 12–14, 1986, Palo Alto, CA, 1987, pp. 131–136.

Green et al., "Structure of Selective Low Pressure Chemically Vapor Deposited Films of Tungsten", 1985 Materials Research Society, Tungsten and Other Refractory Metals for VLSI Applications, Proceedings of the 1985 Workshop held Oct. 7–9, 1985, Albuquerque, NM, pp. 423–432.

Green et al., "The Effects of Dopants and Crystal Perfection on the Chemical Vapor Deposition of Tungsten on Silicon by Silicon Reduction of Tungsten Hexafluoride", 1985 Materials Research Society, Tungsten and Other Refractory Metals for VLSI Applications, p. 209, abstract.

Green et al., "The microstructures of CVD W Films Produced by the Si Reduction of WF6", 1987 Materials Research Society, Tungsten and Other Refractory Metals for VLSI Applications II, Proceedings of the 1986 Workshop held Nov. 12–14, 1986, Palo Alto, CA, 1987, pp. 85–92.

Greub et al., "On the Possibility of Standing Wave Resonnances in the Bypass Capacitor Structure for Wafer Scale Packaging", 1986 Proceedings Third International IEEE VLSI Multilevel Interconnect Conference, IEEE Catalog No. 86CH2337-4, Jun. 9–10, 1986, pp. 250–258.

Grewal et al., "A Novel Multilevel Metallization Technique for Advanced CMOS and Bipolar Integrated Circuits", 1986 Symposium on VLSI Technology, IEEE Catalog No. 86CH2318-4, May 28–30, 1986, San Diego, CA., pp. 107–113.

Gutai et al., "Thermal stability of A1/W/p–n Si Contacts during post–metallization annealing", 1987 Materials Research Society, Tungsten and Other Refractory Metals for VLSI Applications II, Proceedings of the 1986 Workshop held Nov. 12–14, 1986, Palo Alto, CA, 1987, pp. 265–272.

Gutierrez et al., "Evaluation of CVD Tungsten Films for Diffusion Barrier Applications", 1988 Materials Research Society, Tungsten and Other Refractory Metals for VLSI Refractory Applications III, pp. 271–274.

Haken, "Application of the Self–Aligned Titanium Silicide Process to Very Large–Scale Integrated n–Metal–Oxide–Semiconductor and Complementary metal–oxide–microconductor technologies", 1985 American Vacuum Society, Journal of Vacuum Science Technology, vol. 3, No. 6, Nov./Dec. 1985, pp. 1657–1662.

Hall et al., "Electromigration Reliability Studies of Intermetal Contacts Having CVD Tungsten Via Plugs", 1988 Materials Research Society, Tungsten and Other Refractory Metals for VLSI Refractory Applications III, pp. 231–237.

Hara et al., "Tungsten Multi–Layer Interconnections Formed by Chemical Vapor Deposition", Proceedings of the 30th Symposium on Semiconductors and Integrated Circuits Technology, The Electrochemical Society of Japan, Electronic Materials Committee, Jul. 10–11, 1986, pp. 39–44.

Hasse et al., Electromigration Phenomena in TaSi2/n+ and Poly–Si Layers, 1985 Proceedings Second International IEEE VLSI Multilevel Interconnect Conference, IEEE Catalog No. 85CH2197-2, Jun. 25–26, 1985, Santa Clara, CA., pp. 211–216.

Hayasaka et al., "High–Quality and Low Dielectric Constant SiO2 CVD Using High Density Plasma", *Dry Process symposium,* 1993, pp. 163–168.

Hazuki et al., "A Damage Free Perfect Planarization Method Using Bias Sputtered SiO2", 1986 Proceedings Third International IEEE VLSI Multilevel Interconnect Conference, IEEE Catalog No. 86CH2337–4, Jun. 9–10, 1986, Santa Clara, CA., pp. 121–127.

Heiny et al., "Temperature prgammed descriptions of tungsten CVD materials", 1987 Materials Research Society, Tungsten and Other Refractory Metals for VLSI Applications II, Proceedings of the 1986 Workshop held Nov. 12–14, 1986, Palo Alto, CA, 1987, pp. 69–75.

Herndon, "Present and Future Requirements of IC Multilevel Interconnect", 1985 Materials Research Society, Tungsten and Other Refractory Metals for VLSI Refractory Applications, pp. 549–565.

Hess, "Plasma–Enhanced Deposition of Metal Films", 1985 Materials Research Society, Tungsten and Other Refractory Metals for VLSI Refractory Applications, pp. 105–114.

Heunisch, "An analysis of the thermal decomposition of tetraethoxysilane by gas chromatography", *Analytica Chimica Acta,* (1969) 405–409.

Hey et al., "LPCVD Tungsten From Solid Sources", 1985 Materials Research Society, Tungsten and Other Refractory Metals for VLSI Refractory Applications, pp. 393–398.

Hey et al., "Selective Tungsten On Aluminum for Improved VLSI Interconnects", International Electron Devices Meeting, Los Angeles, CA., Dec. 7–10, 1986, pp. 50–53.

Hey et al., "Thick Selective CVD Tungsten Plugs in a Salicided Two Level Metal CMOS Technology", 1988 Materials Research Society, Tungsten and Other Refractory Metals for VLSI Applications III, Proceedings of the 1987 Workshop held Oct. 7–9, 1987, pp. 209–216.

Higelin et al., "A Contact Filling Process With CVD–Tungsten For Multilevel Metallization Systems", 1986 Proceedings Third International IEEE VLSI Multilevel Interconnect Conference, IEEE Catalog No. 86CH2337–4, Jun. 9–10, 1986, Santa Clara, CA., pp. 443–449.

Higelin et al., "Double Level Interconnection System For Submicron CMOS Applications", 1988 IEEE VLSI Multilevel Interconnect Conference, IEEE Catalog No. 88CH2624–5, Jun. 13–14, 1988, pp. 29–34.

Hinode et al., "Mechanism of Silicon Take–up by Aluminum Conducts Layered with Refractory Metals", 1986 Proceedings Third International IEEE VLSI Multilevel Interconnect Conference, IEEE Catalog No. 86CH2337–4, Jun. 9–10, 1986, Santa Clara, CA., pp. 139–145.

Hirase et al., "The Effect of Impurities and Byproducts on Selective W Deposition", 1988 Materials Research Society, Tungsten and Other Refractory Metals for VLSI Applications III, Proceedings of the 1987 Workshop held Oct. 7–9, 1987, pp. 133–140.

Ho et al., "Effects of Interfacial Mixing on the Properties of RF Sputtered NIFe Films", AIP Conference Proceedings, 1976, pp. 39–41.

Hoffmann et al., "Investigationof the diffusion parameters of the borosilicate–silicon system by infrared absorption", J. Phys. D: Appl. Phys., vol. 8, No. 9, 1975, pp. 1044–1052.

Hong et al., "Investigations on Selectively CVD W and Si System", 1988 Materials Research Society, Tungsten and Other Refractory Metals for VLSI Refractory Applications III, pp. 347–350.

Hori et al., "A New MOSFET with Large–Tilt–Angle Implanted Drain (LATID) Structure", *IEEE Electronic Device Letters,* vol. 9, No. 6, Jun. 1988,pp. 300–302.

Hornstorm et al., "Tungsten–Rhenium alloys as Diffusion Barriers Between Aluminum and Silicon", 1988 Materials Research Society, Tungsten and Other Refractory Metals for VLSI Applications III, Proceedings of the 1987 Workshop held Oct. 7–9, 1987, p. 365, summary abstract.

Hsi, "Two–Dimensional Finite Element Analysis of VLSI Wiring Capacitance Using the IBM PC", 1986 Proceedings Third International IEEE VLSI Multilevel Interconnection Conference, IEEE Catalog No. 86CH2337–4, Jun. 9–10, 1986, Santa Clara, CA, Jun. 9–10, 1986, pp. 242–249.

Hu et al., "Diffusion Barrier Studies For CU", 1986 Proceedings Third International IEEE VLSI Multilevel Interconnect Conference, IEEE Catalog No. 86CH2337–4, Jun. 9–10, 1986, Santa Clara, CA., pp. 181–187.

Hu et al., "Stress Development in Polymer Coatings During Thermal Cycling—A Bending–Beam Approach", 1985 Proceedings Second International IEEE VLSI Multilevel Interconnect Conference, IEEE Catalog No. 85CH2197–2, Jun. 25–26, 1985, Santa Clara, CA., pp. 280–284.

Hu et al., "Temperature Dependence of Stresses in Ti, Cr, and Cu Thin Films", 1985 Proceedings Second International IEEE VLSI Multilevel Interconnection Conference, Santa Clara, CA, IEEE Catalog No. 85CH2197–2, Jun. 25–26, 1985, pp. 187–193.

Huggett, "The Use of NF3 as an In–SITU Tube Clean on Selective Tungsten LPCVD Equipment", 1985 Workshop, 1985 Materials Research Society, Tungsten and Other Refractory Metals for VLSI Applications, Proceedings of the 1985 Workshop held Oct. 7–9, 1985, pp. 233–236.

Huppertz et al., "Modeling of low–pressure deposition of SiO2 by decomposition of TEOS", IEEE Transactions on Electron Devices, Jan.–Jun. 1979, No. 1–6, pp. 658–662.

IBM Technical Disclosure Bulletin, "Low Temperature Deposition of SiO2, Si3N4 or SiO2–Si3N4", vol. 28, No. 9, Feb. 1988, p. 70.

Ing, Jr. et al., "Glow discharge formation of silicon oxide and the deposition of silicon oxide thin film capacitors by glow discharge techniques", Electrochemical Society Journal, Jan.–Jun. 1965, pp. 284–288.

Ing, Jr. et al., "Use of low–temperature deposited silicon dioxide films as diffusion masks in GaAs", Electrochemical Society Journal, Jan.–Jun. 1964, pp. 120–122.

Itoh et al., "Tungsten Photochemical Vapor Deposition for VLSI Application and Its Reaction Mechanism", 1988 Symposium on VLSI Technology—Digest of Technical Papers, San Diego, CA, May 28–30, 1986, IEEE Cat. No. 86 CH 2318–4, pp. 57–58.

Iwabuchi, "A Highly Reliable Pure Al Metallization with Low Contact Resistance Utilizing Oxygen–Stuffed TiN Barrier Layer", 1986 Symposium on VLSI Technology, IEEE Catalog No. 86CH2318–4, May 28–30, 1986, San Diego, CA., pp. 55–56.

Jiang et al., "The Preparation of Gaseous Doped LPCVD Polysilicon Film With High Conductivity", 1985 Proceedings Second International IEEE VLSI Multilevel Interconnection Conference, Santa Clara, CA, IEEE Catalog No. 85CH2197–2, Jun. 25–26, 1985, pp. 295–300.

Johannsen et al., "Genesil Silicon Compilation and Design for Testability", 1986 Proceedings Third International IEEE VLSI Multilevel Interconnect Conference, IEEE Catalog No. 86CH2337–4, Jun. 9–10, 1986, Santa Clara, CA., pp. 372–380.

Jones Jr. et al., "Contact Spiking and Electromigration Passivation Cracking Observed for Titanium Layered Aluminum Metallization", 1985 Proceedings Second International IEEE VLSI Multilevel Interconnect Conference, IEEE Catalog No. 85CH2197–2, Jun. 25–26, pp. 194–200.

Jonsson et al., "Chemical vapour deposition of silanes", *Thin Solid Fims*, 424 (1985) 117–123.

Jordan, "A diffusion mask for geranium", Journal of the Electrochemical Society, vol. 108, No. 5, pp. 478–481, May 1961.

Joshi et al., "Characteristics of Selective LPCVD W Films in a Cold Wall System", 1988 Materials Research Society, Tungsten and Other Refractory Metals for VLSI Refractory Applications III, pp. 39–45.

Kirov et al., "Investigation of SiO2 layers deposited by plasma decomposition of tetra–ethoxy silane in a planar Reactor", Institute of Solid State Physics, 45, 609, 1976, Bulgarian Academy of Sciences, pp. 609–614.

Klaus et al., "Atomic Layer Deposition of Tungsten Nitride Films Using Sequential Surface Reactions", Journal of Electrochemical Society, 2000, pp. 1175–1181.

Klerer, "On the mechanism of the deposition of silica by pyrolytic decomposition of silanes", *J. Electrochem. Soc.*, May 1965, pp. 503–506.

Kobayashi et al., "Non–Selective Tungsten CVD Technology for Gate Electrodes and Interconnections", 1986 Proceedings Third International IEEE VLSI Multilevel Interconnect Conference, IEEE Catalog No. 86CH2337–4, Jun. 9–10, 1986, Santa Clara, CA., pp. 436–442.

Kobayashi et al., "Tungsten Gate Technology Using Wet Hydrogen Oxidation", IEDM 1984, Central Research Laboratory, Hitachi, Ltd., pp. 122–125.

Kobayashi et al., "Highly reliable tungsten gate technology", 1987 Materials Research Society, Tungsten and Other Refractory Metals for VLSI Applications II, Proceedings of the 1986 Workshop held Nov. 12–14, 1986, Palo Alto, CA, 1987, pp. 159–167.

Kolawa et al., "Properties of Reactively Sputtered WNx Films", 1987 Materials Research Society, Tungsten and Other Refractory Metals for VLSI Refractory Applications II, pp. 311–317.

Kotera et al., "Magnetoconductance Oscillations of n–type inversion layers in InSb surfaces", Physical Review B, vol. 5, No. 8, Apr. 5, 1972, pp. 3065–3078.

Koyama et al., "New Double Planarization Process for Multilevel Metallization Using Oxide ILD", 1985 Proceedings Second International IEEE VLSI Multilevel Interconnect Conference, IEEE Catalog No. 85CH2197–2, Jun. 25–26, 1985, Santa Clara, CA., pp. 45–51.

Krisht et al., "LPCVD Tungsten Multilayer Metallization for VLSI Systems", 1985 Materials Research Society, Tungsten and Other Refractory Metals for VLSI Refractory Applications, pp. 313–320.

Krongelb, "Environmental effects on chemically vapor–plated silicon dioxide", Electrochemcial Technology, Jul./Aug. 1968, vol. 6, No. 7–8, pp. 251–256.

Kukushkin et al., "Changein the elastically stressed state of Si–SiO2 structures under teh action of a pulsed magnetic field", *Sov. Phys. Techn. Phys.* 30(10), Oct. 1986, pp. 1227–1228.

Kulkarni et al., "The stability of the electrical and structural properties of electron beam deposited and sputter deposited Ta and Mo schottky contacts to GaAs", 1987 Materials Research Society, Tungsten and Other Refractory Metals for VLSI Applications II, Proceedings of the 1986 Workshop held Nov. 12–14, 1986, Palo Alto, Kusomoto et al., "A New Approach to the Suppression of Tunneling", 1987 Materials Research Society, Tungsten and Other Refractory Metals for VLSI Refractory Applications II, pp. 103–109.

Kusumoto et al., "Flow Configuration effects on the deposition properties of selective tungsten", 1987 Materials Research Society, Tungsten and Other Refractory Metals for VLSI Applications II, Proceedings of the 1986 Workshop held Nov. 12–14, 1986, Palo Alto, CA, 1987, pp. 123–129.

Kwakman et al., "A Quantitative Analysis of the Effects of Reaction Byproducts on Selectivity During the Selective Deposition of Tungsten", 1988 Materials Research Society, Tungsten and Other Refractory Metals for VLSI Refractory Applications III, pp. 141–147.

Kwakman et al., "The HF partial pressure as a selectivity determined during the selective deposition of tungsten", 1987 Materials Research Society, Tungsten and Other Refractory Metals for VLSI Applications II, Proceedings of the 1986 Workshop held Nov. 12–14, 1986, Palo Alto, CA, 1987, pp. 377–383.

Kwok et al., "Microstructure Studies of Al–Cu Submicron Interconnection", 1985 Proceedings Second International IEEE VLSI Multilevel Interconnect Conference, IEEE Catalog No. 85CH2197–2, Jun. 25–26, 1985, Santa Clara, CA., pp. 83–89.

Lappara et al., "Low Pressure CVD For Selective Tungsten", 1986 Proceedings Third International IEEE VLSI Multilevel Interconnect Conference, IEEE Catalog No. 86CH2337–4, Jun. 9–10, 1986, Santa Clara, CA., p. 391, abstract.

Lardon et al., "Metallization of High Aspect Microstructures with a Multiple Cycle Evaporation–Sputter Etching Process", 1986 Proceedings Third International IEEE VLSI Multilevel Interconnect Conference, IEEE Catalog No. 86CH2337–4, Jun. 9–10, 1986, Santa Clara, CA, pp. 212–218.

Lee et al., "Chemical Vapor Deposition of Tungsten (CVD W) as Submicron Interconnection and Via Stud", Journal of Electrochemical Society, vol. 136, No. 7, Jul. 1989, pp. 2108–2112.

Legoues et al., "A New Technique for Failure Analysis—Cross–Sectional Tranmission Electron Microscopy of Devices", 1986 Proceedings Third International IEEE VLSI Multilevel Interconnect Conference, IEEE Catalog No. 86CH2337–4, Jun. 9–10, 1986, Santa Clara, CA, pp. 153–164.

Levin et al., "Low pressure deposition of phosphosilicate glass films", J. Electrochem. Soc., Jul.–Sep. 1982, No. 7–9, pp. 1588–1592.

Levin et al., "The step coverage of undoped and phosphorus–doped SiO2 glass films", *J. Vac. Sci. Technol.* B 1 (1), Jan.–Mar. 1983, pp. 54–61.

Levin, "Water absorption and densification or phosphosilicate glass films", J. Electrochem. Soc., vol. 129, No. 8, Aug. 1982, pp. 1765–1770.

Levy et al., "A new LPCVD technique of producing borophosposilicate glass films by injection of miscible liquid precursors", Electrochemical Society Journal, Jan.–Mar. 1987, No. 1–3, pp. 430–436.

Lie et al., "Contact Resistance of Al–1%Si–0.5%Cu and Al–TiW–PtSi Metallization", 1985 Proceedings Second International IEEE VLSI Multilevel Interconnect Conference, IEEE Catalog No. 85CH2197–2, Jun. 25–26, 1985, Santa Clara, CA., pp. 201–210.

Lifshitz et al., "Microstructural characterization of molybdenum films deposited by LPCVD", 1987 Materials Research Society, Tungsten and Other Refractory Metals for VLSI Applications II, Proceedings of the 1986 Workshop held Nov. 12–14, 1986, Palo Alto, CA, 1987, pp. 215–223.

Lifshitz et al., "Shallow Silicide Diodes with LPCVD Tungsten Plug", 1988 Materials Research Society, Tungsten and other refractory metals for VLSI Applications III, Proceedings of the 1987 Workshop held Oct. 7–9, 1987, NY, pp. 225–229.

Lifshitz, "The Nature and Significance of the Self–Limiting Effect in the Low Pressure Chemical Vapor Deposition of Tungsten", 1988 Materials Research Society, Tungsten and Other Refractory Metals for VLSI Applications III, 1988, pp. 83–86.

Lin et al., "Crystallization of Amorphous Tungsten–Rhenium and Tungsten–Nitrogen Thin Films", 1988 Materials Research Society, Tungsten and Other Refractory Metals for VLSI Refractory Applications III, pp. 287–292.

Liu et al., "Contact Size Dependence of Highly Selective Self–Aligned Contact Etching with Polymer Formation and its Mechanism", *IEEE/SEM Advanced Semiconductor Manufacturing Conference*, (2000), pp. 153–156.

Liu, "Laser Direct Writing of Tungsten Lines for VLSI Applications", 1985 Materials Research Society, Tungsten and Other Refractory Metals for VLSI Refractory Applications, pp. 43–52.

Lubowiecki et al., "A Refractory Metal Gate Approach for Micronic CMOS Technology", 1987 Materials Research Society, Tungsten and Other Refractory Metals for VLSI Refractory Applications II, pp. 169–176.

Mackens et al., "Plasma–enhanced chemically vapour–deposited silicon oxide for metal/oxide/semiconductor structures on Sb", *Thin Solid Films*, 97(1982), pp. 53–61.

Maclaury et al., "Chemical Characterization of CVD Tungsten", 1985 Materials Research Society, Tungsten and Other Refractory Metals for VLSI Refractory Applications, pp. 467–473.

Maeda et al., "Effects of Ti Interlevel Existence in Al–Tl–TiN–Tl Structure for Highly Reliable Interconnection", 1985 Symposium of VLSI Technology, pp. 50–51.

Maeda et al., "Highly Reliable One–Micron–Rule Interconnection Utilizing TiN Barrier Metal", 1985 Proceedings Second International IEEE VLSI Multilevel Interconnect Conference, IEEE Catalog No. 85CH2197–2, Jun. 25–26, 1985, Santa Clara, CA., pp. 610–613.

Maeda et al., "Tl Thickness Optimization of TiN/Ti Barrier Metal Structure Based Upon BF2+ Induced Damage Analysis", V–MIC Conference, 1986 Proceedings Third International IEEE VLSI Multilevel Interconnect Conference, IEEE Catalog No. 86CH2337–4, Jun. 9–10, 1986, pp. 411–417.

Maeda et al., "Very low temperature chemical vapor deposition of silicon dioxide films using ozone and organosilane", Denki Kagaku, vol. 45, No. 10 (1977), pp. 654–659.

Maher, Jr. et al., "Selective Etching of Silicon Dioxide Films", *Semiconductor International*, 1983, pp. 110–114.

Mak et al., "Fine Line Patterning for Multilevel Metallization in VLSI with Layered Structures", 1986 Proceedings Third International IEEE VLSI Multilevel Interconnect Conference, IEEE Catalog No. 86CH2337–4, Jun. 9–10, 1986, Santa Clara, CA., pp. 65–70.

Matsuda et al., "Reliable CVD inter–poly dielectrics for advanced E&EEPROM", *The Japan Society of Applied Physics*, 1985 Symposium on VLSI Technology, May 14–16, 1985, pp. 16–17.

Mazerolles, "Formation of amorphous semiconductors by chemical vapour deposition from organo–geranium compounds", The 5th International Conference on the Organometallic and Coordination Chemistry of German, Tin & Lead, 1986, vol. IX, Nos. 2&3, pp. 155–183.

Mazza et al., "Tungsten, Titanium, and Tantalum Carbides and Titanium Nitrides as Electrodes in Redox Systems", Journal of Electrochemical Society, Jul. 1963, pp. 847–849.

McConica et al., "Kinetics of Low Pressure Chemical Vapor Deposition of Tungsten", 1985 Materials Research Society, Tungsten and Other Refractory Metals for VLSI Refractory Applications, pp. 433–442.

McConica et al., "Modeling Selectivity Loss During CVD Tungsten Deposition", 1988 Materials Research Society, Tungsten and Other Refractory Metals for VLSI Refractory Applications III, pp. 125–131.

McConica et al., "Step Coverage Prediction During Blanket CVD Tungsten Deposition", 1988 Materials Research Society, Tungsten and Other Refractory Metals for VLSI Refractory Applications III, pp. 257–262.

McConica et al., "The Kinetics of Tungsten Growth on Thermal Oxide", 1985 Workshop, 1985 Materials Research Society, Tungsten and Other Refractory Metals for VLSI Applications, Proceedings of the 1985 Workshop held Oct. 7–9, 1985, Albuquerque, NM, pp. 197–206.

McConica, "A model for tungsten nucleation on oxide", 1987 Materials Research Society, Tungsten and Other Refractory Metals for VLSI Applications II, Proceedings of the 1986 Workshop held Nov. 12–14, 1986, Palo Alto, CA, 1987, pp. 51–57.

McDavid, "Mo–Gate/Clad–Moat/Clad–Tungsten–Interconnect VLSI Device Process", 1985 Materials Research Society, Tungsten and Other Refractory Metals for VLSI Refractory Applications, pp. 539–545.

McGreivy, "Interconnects/Gates in VLSI Technology", VLSI Technologies Through the 80s and Beyond, IEEE Computer Society, IEEE Catalog No. EHO192–5, 1982, pp. 185–194.

McInerney, "An In Situ Planarized PECVD Silicon Dioxide Interlayer Dielectric", 1986 Proceedings Third International IEEE VLSI Multilevel Interconnect Conference, IEEE Catalog No. 86CH2337–4, Jun. 9–10, 1986, Santa Clara, CA., pp. 467–473.

McIntyre et al., "Self Aligned Silicide Interconnection Technology for CMOS IC's", 1986 Proceedings Third International IEEE VLSI Multilevel Interconnect Conference, IEEE Catalog No. 86CH2337–4, Jun. 9–10, 1986, Santa Clara, CA., pp. 530–536.

Mehta et al., "Blanket CVD Tungsten Interconnect for VLSI Devices", 1985 Proceedings Second International IEEE VLSI Multilevel Interconnection Conference, IEEE Catalog No. 85CH2197–2, Jun. 25–26, 1985, Santa Clara, CA, pp. 418–435.

Mehta et al., "Reliability of devices with tungsten elements", panel discussion, 1987 Materials Research Society, Tungsten and Other Refractory Metals for VLSI Applications II, Proceedings of the 1986 Workshop held Nov. 12–14, 1986, Palo Alto, CA, 1987, pp. 411–418.

Metz et al., "A Manufacturable Selective Tungsten Process for Applications in VLSI CMOS Devices", 1985 Symposium on VLSI Technology, IEEE Catalog No. 85CH2125–3, May 14–16, 1985, Kobe, pp. 48–49.

Metz et al., "LPCVD Tungsten Metallization for Multilevel Interconnect Processes", 1985 Materials Research Society, Tungsten and Other Refractory Metals for VLSI Refractory Applications, pp. 249–256.

Metz et al., "Reproducibility and Reliability of Selective Tungsten Shunt and Contact Applications in CMOS LSI Circuits", 1985 Materials Research Society, Tungsten and Other Refractory Metals for VLSI Refractory Applications, pp. 527–532.

Mianowski et al., "Tungsten Selective Deposition by APCVD", 1985 Materials Research Society, Tungsten and Other Refractory Metals for VLSI Applications, Proceedings of the 1985 Workshop held Oct. 7–9, 1985, Albuquerque, NM, pp. 145–158.

Mihara et al., "WSI2 Interconnection Technology for SMOS VLSIs", 1986, Santa Clara, CA, pp. 396–402.

Mikkleson et al., "An NMOS VLSI Process for Fabrication of a 32–Bit CPU Chip", IEEE Journal of Solid–State Circuits, vol. SC–16, No. 5, Oct. 1981, pp. 542–547.

Miller et al., "CVD Tungsten Interconnect and Contact Barrier Technology for VLSI", Solid State Technology, Dec. 1982, pp. 85–90.

Miller et al., "Hot Wall CVD Tungsten for VLSI", Solid State Technology, Dec. 1980, pp. 79–82.

Miller, "CVD Tungsten Technology A Brief History", 1985 Materials Research Society, Tungsten and Other Refractory Metals for VLSI Refractory Applications, pp. 375–390.

Miller, "Practicalities of WF6 Mass Flow Control", 1985 Materials Research Society, Tungsten and Other Refractory Metals for VLSI Refractory Applications, pp. 457–462.

Minkina et al., "Perolytic deposition of SiO2 films in a reactor of the flow type in steady–state operation", *J. Applied Chem. of the USSR*, vol. 58, No. 5, Part 2, May 1985, pp. 1053–1055.

Mitchener et al., "Low Pressure CVD—High Quality SiO2 Dielectric Films at High Deposition Rates", 1986 Proceedings Third International IEEE VLSI Multilevel Interconnect Conference, IEEE Catalog No. 86CH2337–4, Jun. 9–10, 1986, Santa Clara, CA., pp. 298–307.

Mogami et al., "Planarized Molybdenum Interconnections Using Via–Hole Filing by Bias Sputtering", 1985 Proceedings Second International IEEE VLSI Multilevel Interconnect Conference, IEEE Catalog No. 85CH2197–2, Jun. 25–26, 1985, Santa Clara, CA., pp. 17–23.

Mohr, "Making tunnel barrier layers by plasma deposition", IBM Technical Disclosure Bulletin, vol. 22, No. 3, Aug. 1979, p. 1194.

Moriya et al., "A Planar Metallization Process—Its Application to Tri–Level Aluminum Interconnection", International Electron Devices Meeting, Dec. 5–7, 1983, Washington, D.C., pp. 550–553.

Moriya et al., "Selective CVD of Tungsten and Its Applications to MOS VLSI", 1985 Materials Research Society, Tungsten and Other Refractory Metals for VLSI Refractory Applications, pp. 21–32.

Moslehi, "Formation of Tungsten Thin Films for Integrated Circuit Applications", 1988 Materials Research Society, Tungsten and Other Refractory Metals for VLSI Refractory Applications III, pp. 385–398.

Mukherjee et al., "The deposition of thin films by the decomposition of tetra–ethoxy silane in a radio frequency glow discharge", *Thin Solid Films* 14 (1972) 105–118.

Mulligan Jr., "Coupled Transmission Line Transients in VLSI Systems", 1985 Proceedings Second International IEEE VLSI Multilevel Interconnect Conference, IEEE Catalog No. 85CH2197–2, Jun. 25–26, 1985, Santa Clara, CA., pp. 241–249.

Murarka, "Interactions in Metallization Systems for Integrated Circuits", 1984 American Vacuum Society, Journal of Vacuum Science Technology, Oct.–Dec. 1984, pp. 693–704.

Murarka, "Phosphorus out–diffusion during high–temperature anneal of phosphorus–doped polycrystalline silicon and SiO2", *J. Appl. Phys.* 56 (8), Oct. 15, 1984, pp. 2225–2230.

Nicolet, "Thin Film Diffusion Barriers for Metal–Semiconductor Contacts", 1987 Materials Research Society, Tungsten and Other Refractory Metals for VLSI Applications II, Proceedings of the 1986 Workshop held Nov. 12–14, 1986, Palo Alto, CA, 1987, pp. 19–26.

Nicolet, "Diffusion Barriers in Thin Films", Thin Solid Films, Thin Solid Films, 52 (1978), pp. 415–443.

Nowicki et al., "Practical Preparation of Sputtered Refractory Metal Diffusion Barriers", 1987 Materials Research Society, Tungsten and Other Refractory Metals for VLSI Refractory Applications II, pp. 333–337.

Nowicki et al., "Studies of the Diffusion Barrier Properties of DC Magnetron Sputtered Titanium–Tungsten on Gallium Arsenide and Silicon", 1985 Materials Research Society, Tungsten and Other Refractory Metals for VLSI Applications, Proceedings of the 1985 Workshop, pp. 341–352.

Oehrlein et al., "Investigation of reactive–ion–etching–related fluorocarbon film deposition onto silicon and a new method for surface residue removal", J. Electrochem. Soc., 133 (1986) May, No. 5, pp. 1002–1008.

Ogawa et al., "Thermally Stable w/Silicide/Si Contact", Technical Digest, International Electron Devices Meeting, Los Angeles, CA, Dec. 7–10, 1986, pp. 62–65.

Ohba et al., "Evaluation on selective deposition of CVD W Films by measurement of surface temperature", 1987 Materials Research Society, Tungsten and Other Refractory Metals for VLSI Applications II, Proceedings of the 1986 Workshop held Nov. 12–14, 1986, Palo Alto, CA, 1987, pp. 59–66.

Ohba, T. et al., "Using Silane and Polysilane Reductions", 1989 Materials Research, pp. 17–24.

Okabayashi, "Multilevel Metallization Technology for VLSI", 1984 Symposium on VLSI Technology, IEEE Catalog No. 84CH2061–0, Sep. 10–12, 1984, San Diego, CA., pp. 20–23.

Oroshnik et al., "Pyrolytic Deposition of Silicon Dioxide in an Evacuated System", *J. Electrochem. Soc.,* Solid State Science, vol. 115, No. 6, Jun. 1968, pp. 649–652.

Owada et al., "Stress Induced Slit–Like Void Formation in a Fine–Pattern Al–Si Interconnect During Aging Test", 1985 Proceedings Second International IEEE VLSI Multilevel Interconnect Conference, IEEE Catalog No. 85CH2197–2, Jun. 25–26, 1985, Santa Clara, CA, pp. 173–179.

Pai et al., "A High Resolution Lift–Off Technology for VLSI Interconnections", 1986 Proceedings Third International IEEE VLSI Multilevel Interconnect Conference, IEEE Catalog No. 86CH2337–4, Jun. 9–10, 1986, Santa Clara, CA., pp. 205–211.

Paine et al., "Metastable B–Tungsten in LPCVD Contacts to Silicon", 1988 Materials Research Society, Tungsten and Other Refractory Metals for VLSI Refractory Applications III, pp. 95–101.

Paine et al., "Microstructural Characterization of LPCVD Tungsten Interfaces", 1985 Proceedings Second International IEEE VLSI Multilevel Interconnect Conference, IEEE Catalog No. 85CH2197–2, Jun. 25–26, 1985, Santa Clara, CA., pp. 117–123.

Pande et al., "A novel low–temperature method of SiO2 film deposition for MOSFET applications", *J. of Electronic Materials,* vol. 13, No. 3, 1984, pp. 593–602.

Pande et al., "Plasma enhanced metal–organic chemical vapor deposition of aluminum oxide dielectric film for device applications", J. Appl. Phys., vol. 54, No. 9, Sep. 1983, pp. 5436–5440.

Parekh et al., "The influence of the reaction kinetics of O2 and source flow rates on the uniformity of boron and arsenic diffusions", Solid State Electronics, vol. 14, No. 4, Apr. 1971, pp. 281–288.

Park et al., "The Characterization of Titanium–Nitride Thin Film as Diffusion Barrier for VLSI Metallization", 1987 Materials Research Society, Tungsten and Other Refractory Metals for VLSI Applications II, Proceedings of the 1986 Workshop held Nov. 12–14, 1986, Palo Alto, CA, pp. 275–282.

Pauleau et al., "Growth Kinetics and Properties of Selectively Deposited Tungsten Films", 1985 Materials Research Society, Tungsten and Other Refractory Metals for VLSI Refractory Applications, pp. 135–143.

Pauleau et al., "Thermal Stability of W/Si and AlW/Si Structures", 1988 Materials Research Society, Tungsten and Other Refractory Metals for VLSI Applications III, Proceedings of the 1987 Workshop held Oct. 7–9, 1987, Yorktown Heights, NY, 1988, pp. 275–279.

Pauleau, "Chemical Vapor Deposition of Tungsten Films for Metallization of Integrated Circuits", Thin Solid Films, 122 (1984), pp. 243–258.

Peek et al., "Bubble and Cavity Formation in Aluminum–Plasma Silicon Nitride Structures", 1986 Proceedings Third International IEEE VLSI Multilevel Interconnect Conference, IEEE Catalog No. 86CH2337–4, Jun. 9–10, 1986, Santa Clara, CA, pp. 165–172.

Saraswat, "Refractory metal Silicide Systems", Visuals Booklet, 1986 VLSI Multilevel Interconnection State–Of–The–Art Seminar, Santa Clara, CA, Jun. 11, 1986, pp. 46–85.

Saraswat, "Selective CVD of Tungsten for MOS VLSI Application", 1985 Materials Research Society, Tungsten and Other Refractory Metals for VLSI Refractory Applications, abstract, p. 465.

Saraswat, "Silicides for VLSI", Center for Integrated Systems, Stanford University, VLSI Seminar, 1985, pp. 78–125.

Saxena et al., "Manufacturing Issues and Emerging Trends in VLSI Multilevel Metallizations", 1986 Proceedings Third International IEEE VLSI Multilevel Interconnect Conference, IEEE Catalog No. 86CH2337–4, Jun. 9–10, 1986, Santa Clara, CA, 34 pages.

Saxena, "Update and Future Directions for VLSI Multilevel Metalization Technologies", Visuals Booklet, 1986 VLSI Multilevel Interconnection State–Of–The–Art Seminar, Santa Clara, CA, Jun. 11, 1986, pp. 1–45.

Saxena, "VLSI Multilevel Metalizations: The Role of Tungsten", Material Research Society, Tungsten and Other Refractory Metals for VLSI Applications, 1985, Proceedings of the 1985 Workshop held Oct. 7–9, 1985, Albuquerque, NM, pp. 355–362.

Saxena, "VSLI Introduction and Overview", 1985 VLSI Multilevel Interconnection Short Course, Santa Clara, CA, Jun. 24, 1985, pp. 1–53.

Saxena, Future Trends, "VLSI Multilevel Interconnections Seminar Part IV: Future Trends", ANS 6/85, 1985 VLSI Multilevel Interconnection Short Course, Santa Clara, CA, Jun. 24, 1985, pp. 371–386.

Schmitz et al., "Characterization of Process Parameters for Blanket Tungsten Contact Fill", 1988 Materials Research Society, Tungsten and Other Refractory Metals for VLSI Refractory Applications III, pp. 55–61.

Schulte et al., "Diffusion Barrier Studies of TiN between Aluminum and Silicon", 1988 Materials Research Society, Tungsten and Other Refractory Metals for VLSI Refractory Applications III, pp. 367–373.

Schutz, "TiN as a Diffusion Barrier Between CoSi2 or PtSi and Aluminum", Thin Solid Films, vol. 104 (Containing Papers Presented at the Symposium on Interfaces and Contacts, Boston, MA, Nov. 2–4, 1984), 1985, pp. 89–99.

Scott et al., "A solid–to–solid diffusion technique", RCA Review, Sep. 1965, pp. 357–368.

Secrest et al., "Incorporation of water into vapour deposited oxide films", Solid State Electronics, Pergamon Press 1966, printed in Great Britain, vol. 9, pp. 180–181.

Secrist et al., "Deposition of silica films by the glow discharge technique", *J. of the Electrochemical Society,* Sep. 1966, pp. 914–920.

Seidel, "CMOS Process Review with Implication for Ion Implantation", Nuclear Instruments and Methods in Physics Research (1987), pp. 96–103.

Sekiyama et al., "The Investigation for Introduction of SAC Etching Technique to Mass Productive DRAM Process", IEEE, 1997, pp. F–17–F–20.

Shaw et al,. "Vapor–Deposited Tungsten as a Metallization and Interconnection Material for Silicon Devices", RCA Review, Jun. 1970, pp. 306–316.

Shen et al., "A Highly Reliable Aluminum Metallization for Micron and Submicron VLSI Applications", 1986 Proceedings Third International IEEE VLSI Multilevel Interconnect Conference, IEEE Catalog No. 86CH2337–4, Jun. 9–10, 1986, Santa Clara, CA., pp. 191–197.

Shen et al., "An Evaluation of Titanium Interlayered Aluminum Films for VLSI Metallization", 1985 Proceedings Second International IEEE VLSI Multilevel Interconnect Conference, IEEE Catalog No. 85CH2197–2, Jun. 25–26, 1985, Santa Clara, CA., pp. 114–120.

Shenai et al., "Characteristics of As–Deposited and Sintered Mo–LPCVD W Contacts to As, B, and P Doped Silicon", 1988 Materials Research Society, Tungsten and Other Refractory Metals for VLSI Refractory Applications III, pp. 219–224.

Shenai et al., "High Temperature Stability of TiSi2–n+–Polysilicon–SiO2–Si MOS Structures Formed by Conventional Thermal and Rapid Thermal Annealing", 1988 Materials Research Society, Tungsten and Other Refractory Metals for VLSI Refractory Applications III, pp. 333–338.

Shetti et al., "Multiplexed Test Structure in Testbar Design", 1985 Proceedings Second International IEEE VLSI Multilevel Interconnect Conference, IEEE Catalog No. 85CH2197–2, Jun. 25–26, 1985, Santa Clara, CA., pp. 380–386.

Shibata et al., "An Optimally Designed Process for Submicron Mosfets", IEEE Journal of Solid–State Circuits, vol. SC–17, 1981, pp. 647–653.

Shioya et al., "Changes in Resistivity and Composition of Chemical Vapor Deposited Tungsten Silicide Films by Annealing", Journal of Electrochemical Society, Solid–State Science and Technology, Jul. 1986, pp. 1475–1479.

Shukla et al., "Formation Kinetics and Properties of Titanium Nitride Formed by Rapid Thermal Annealing", 1987 Materials Research Society, Tungsten and Other Refractory Metals for VLSI Refractory Applications II, pp. 291–300.

Sivaram et al., "Underlayer Dependence of Thin Film Stresses in Blanket CVD Tungsten", 1988 Material Research Society, Tungsten and Other Refractory Metals for VLSI Applications III, Proceedings of the 1987 Workshop held Oct. 7–9, 1987, pp. 407–414.

Smalinsky et al., "Measurements of temperature dependent stress of silicon oxide films prepared by a variety of CVD methods", *J. Electrochem. Soc.,* Apr. 1985, vol. 132, No. 4, pp. 950–954.

Smith et al., "Comparison of Two Contact Plug Techniques for Use with Planarized Oxide", 1985 Proceedings Third International IEEE VLSI Multilevel Interconnect Conference, IEEE Catalog No. 86CH2337–4, Jun. 9–10, 1986, Santa Clara, CA., pp. 403–410.

Smith, "Contact Resistance Results on CVD Blanket Tungsten Plugs", 1985 Materials Research Society, Tungsten and Other Refractory Metals for VLSI Refractory Applications, pp. 323–328.

Smith, "CVD Tungsten Contact Plugs by In Situ Deposition and Etchback", 1985 Proceedings Second International IEEE VLSI Multilevel Interconnect Conference, IEEE Catalog No. 85CH2197–2, Jun. 25–26, 1985, Santa Clara, CA., pp. 350–356.

So et al., "Thermal and Stability and Nitrogen Redistribution in the TiNN–N Bilayer", 1987 Materials Research Society, Tungsten and Other Refractory Metals for VLSI Applications II, Proceedings of the 1986 Workshop held Nov. 12–14, 1988, Palo Alto, CA, 1987, pp. 301–310.

Solanki et al., "Photodeposition of Tungsten", 1985 Materials Research Society, Tungsten and Other Refractory Metals for VLSI Refractory Applications, pp. 399–404.

Song et al., "Observation of the anomalous concentration profiles of antimony atoms diffused into silicon due to local precipitation", J. Electrochem. Soc., vol. 129, No. 4, Apr. 1982, pp. 841–846.

Sridhar et al., "Characterization of Tungsten Silicide Films Deposited from Ultrahigh Density Composite Target", 1985 Materials Research Society, Tungsten and Other Refractory Metals for VLSI Refractory Applications, pp. 267–280.

Stacy et al., "Interfacial Structure of Tungsten Layers Formed by Selective LPCVD", 1985 Materials Research Society, Tungsten and Other Refractory Metals for VLSI Refractory Applications, pp. 507–515.

Stimmell et al., "Effects of Oxygen on Reactively Sputtered TiN Films", 1988 Materials Research Society, Tungsten and Other Refractory Metals for VLSI Refractory Applications III, pp. 375–382.

Sugawara et al., "Formation of PSG film organic compounds and its application to silicon device fabrication", Proceedings of the Conference on Chemical Vapor Deposition, 5th International Conference, 1975, pp. 407–420.

Suguro et al., "High Aspect Ratio Hole Filling by Tungsten Chemical Vapor Deposition Combined with a Silicon Sidewall and Barrier Metal for Multilevel Interconnection", Journal of Applied Physics, 62 (4), Aug. 15, 1987, pp. 1265–1273.

Suguro et al., "High Aspect Ratio Hole Filling with CVD Tungsten for Multilevel Interconnection", Extended Abstracts of the 18th (1986 International Conference on Solid State Devices and Materials, The Japan Society of Applied Physics, Aug. 20–22, 1986, pp. 503–506.

Sun et al., "A 1.0 Micron AlW/TiNx/TiSly/Sl Contact Technology", 1988 Materials Research Society, Tungsten and Other Refractory Metals for VLSI Refractory Applications III, pp. 353–356.

Suzuki, "Development of refractory metals and silicides targets, and their characteristics", 1987 Materials Research Society, Tungsten and Other Refractory Metals for VLSI Applications II, Proceedings of the 1986 Workshop held Nov. 12–14, 1986, Palo Alto, CA, 1987, pp. 339–345.

Sze, VLSI Technology, edt., McGraw–Hill Series in Electrical Engineering, 1983, entire book, pp. 1–654.

Tai et al., "An Optimized Double Level Metallization Process Using RIE Planarization Technology Technique"s, 1985 Proceedings Second International IEEE VLSI Multilevel Interconnect Conference, IEEE Catalog No. 85CH2197–2, Jun. 25–26, 1985, Santa Clara, CA., pp. 138–144.

Wang, "Plasma Etching of Poly SL in SF6—O2 Mixtures", 1985 Proceedings Second International IEEE VLSI Multilevel Interconnect Conference, IEEE Catalog No. 85CH2197–2, Jun. 25–26, 1985 Santa Clara, CA., pp. 335–339.

Wei et al., "Formation of Self–Aligned TiN/CoSi2 Bilayer From Co/Ti/Si and its Applications in Salicide, Diffustion Barrier and Contact Fill", VMIC Conference, Jun. 12–13, 1990, pp. 233–239.

Weiss, "Plasma enhanced CVD: Silicon nitride & Beyond", Semiconductor International, Jul. 1983, pp. 88–94.

Welch et al., "Pillar Interconnections for VLSI Technology", 1986 Proceedings Third International IEEE VLSI Multilevel Interconnect Conference, IEEE Catalog No. 86CH2337–4, Jun. 9–10, 1986, Santa Clara, CA., pp. 450–456.

Wells et al., "LPCVD Tungsten Deposition on SI–Ge Alloy", 1985 Materials Research Society, Tungsten and Other Refractory Metals for VLSI Refractory Applications, pp. 497–504.

Wells, "Tungsten and Other Refactory Metals for VLSI App III", Proceedings of the 1987 Workshop held Oct. 7–9, 1987, 1988, pp. 1–428.

Wendling et al., "Selective CVD of TaSi2", 1987 Materials Research Society, Tungsten and Other Refractory Metals for VLSI Applications II, Proceedings of the 1986 Workshop held Nov. 12–14, 1986, Palo Alto, CA, 1987, pp. 111–122.

Wendling et al., "Selective LPCVD TaSi2 for Source & Drain Metallization and Contact Hole Filling", 1988 Materials Research Society, Tungsten and Other Refractory Metals for VLSI Refractory Applications III, pp. 239–248.

Westbrook et al., "A Multilevel Interconnect Test Vehicle for Wafer Scale Integration", 1985 Proceedings Second International IEEE VLSI Multilevel Interconnect Conference, IEEE Catalog No. 85CH2197–2, Jun. 25–26, 1985, Santa Clara, CA., pp. 373–379.

Whetten et al., "Reactive ion etching of submicometer size features in tungsten thin films", 1987 Materials Research Society, Tungsten and Other Refractory Metals for VLSI Applications II, Proceedings of the 1986 Workshop held Nov. 12–14, 1986, Palo Alto, CA, 1987, pp. 363–369.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–8, 10 and 11 is confirmed.

Claim 9 is determined to be patentable as amended.

9. A method as recited in claim 8 in which said glue layer comprises a conducting [nutride] *nitride*.

\* \* \* \* \*